US010163989B2

(12) United States Patent
Yamazaki et al.

(10) Patent No.: US 10,163,989 B2
(45) Date of Patent: Dec. 25, 2018

(54) DISPLAY DEVICE AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Johan Bergquist, Tokyo (JP); Daisuke Kubota, Kanagawa (JP); Kei Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/707,485

(22) Filed: Sep. 18, 2017

(65) Prior Publication Data

US 2018/0083074 A1    Mar. 22, 2018

(30) Foreign Application Priority Data

Sep. 20, 2016  (JP) ................................. 2016-182655

(51) Int. Cl.
*H01L 27/32* (2006.01)
*H05K 5/00* (2006.01)

(52) U.S. Cl.
CPC ....... *H01L 27/3232* (2013.01); *H05K 5/0017* (2013.01); *G09G 2300/023* (2013.01); *G09G 2300/046* (2013.01)

(58) Field of Classification Search
CPC ....... H01L 27/32; H01L 27/3232; H05K 5/00; H05K 5/0017; G09G 2300/023; G09G 2300/046
USPC ....................................................... 361/749
See application file for complete search history.

(56) References Cited

U.S. PATENT DOCUMENTS

| 8,854,286 B2 | 10/2014 | Yamazaki et al. |
| 9,368,082 B2 | 6/2016 | Yamazaki et al. |
| 2015/0242032 A1* | 8/2015 | Furuhashi ............. G06F 3/0412 345/173 |
| 2016/0042702 A1 | 2/2016 | Hirakata et al. |

(Continued)

FOREIGN PATENT DOCUMENTS

JP    2011-141522 A    7/2011

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

(Continued)

*Primary Examiner* — Tremesha S Willis
(74) *Attorney, Agent, or Firm* — Husch Blackwell LLP

(57) ABSTRACT

A display device that has an excellent visibility even under strong light is provided. In the display device, a first display element that reflects visible light and a second display element that emits visible light are between a first substrate and a second substrate. The display device can display an image with high visibility by operating the first display element under strong light and operating the second display element under weak light. Furthermore, a first surface of the second substrate is provided with a touch sensor, and a second surface opposite to the first surface is provided with an anti-reflection layer. Such a structure can sufficiently reduce reflection of external light on the display surface under strong light, further increasing the visibility.

24 Claims, 28 Drawing Sheets

(56) References Cited

U.S. PATENT DOCUMENTS

| | | |
|---|---|---|
| 2016/0232868 A1 | 8/2016 | Yamazaki et al. |
| 2016/0283028 A1 | 9/2016 | Yamazaki et al. |
| 2016/0299387 A1 | 10/2016 | Yamazaki et al. |
| 2016/0358986 A1 | 12/2016 | Yamazaki et al. |
| 2017/0004788 A1 | 1/2017 | Yamazaki et al. |
| 2017/0031192 A1 | 2/2017 | Yamazaki et al. |
| 2017/0031471 A1 | 2/2017 | Yamazaki et al. |
| 2017/0033172 A1 | 2/2017 | Yamazaki et al. |
| 2017/0038641 A1 | 2/2017 | Yamazaki |
| 2017/0039931 A1 | 2/2017 | Kubota et al. |
| 2017/0040402 A1 | 2/2017 | Yasumoto et al. |
| 2017/0040403 A1 | 2/2017 | Kuwabara |
| 2017/0040404 A1 | 2/2017 | Kusunoki |
| 2017/0053603 A1 | 2/2017 | Hirakata |
| 2017/0061863 A1 | 3/2017 | Eguchi |
| 2017/0062528 A1 | 3/2017 | Aoyama et al. |
| 2017/0075155 A1 | 3/2017 | Oikawa et al. |
| 2017/0082882 A1 | 3/2017 | Hirakata et al. |
| 2017/0082887 A1 | 3/2017 | Kubota et al. |
| 2017/0090246 A1 | 3/2017 | Seo et al. |
| 2017/0092177 A1 | 3/2017 | Kobayashi et al. |
| 2017/0098689 A1 | 4/2017 | Ikeda et al. |

OTHER PUBLICATIONS

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

* cited by examiner

FIG. 8A
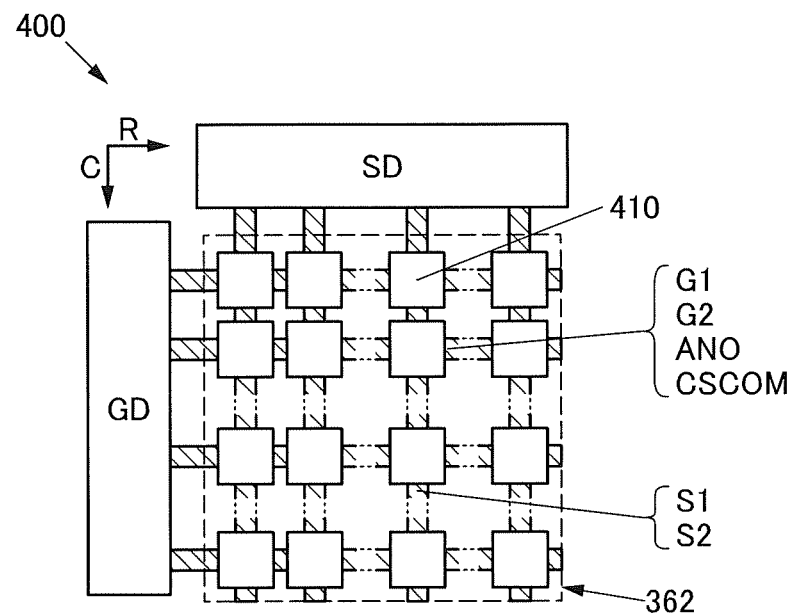
FIG. 8B1
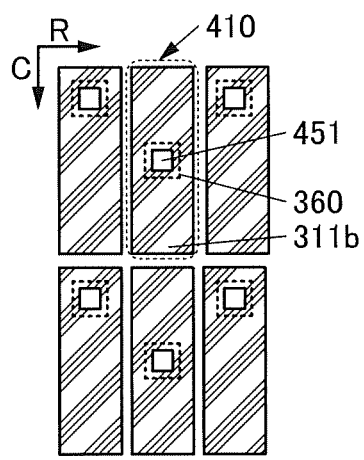
FIG. 8B2
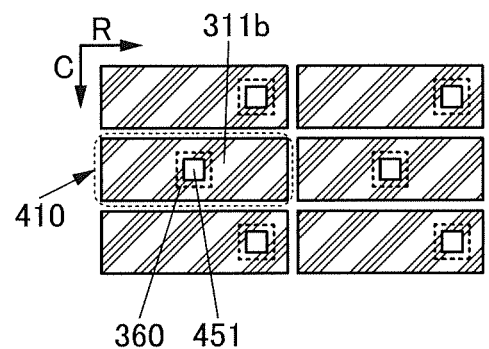

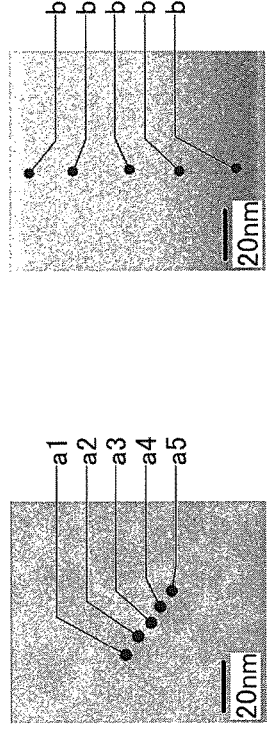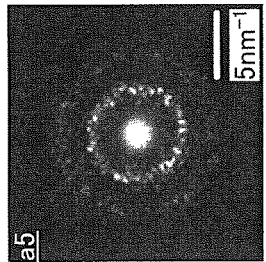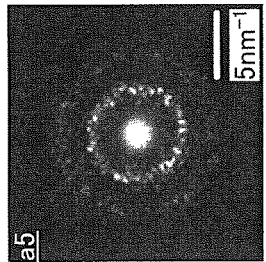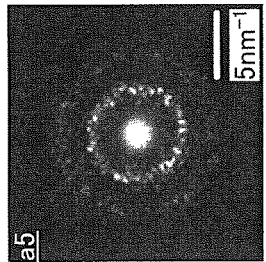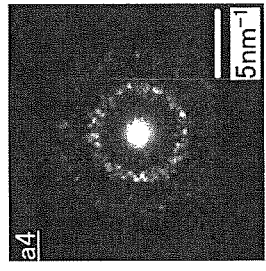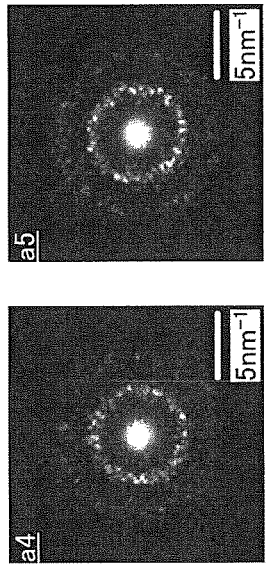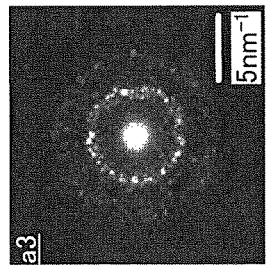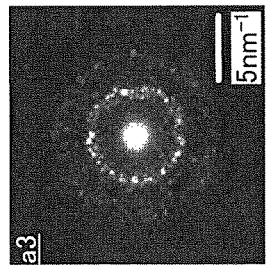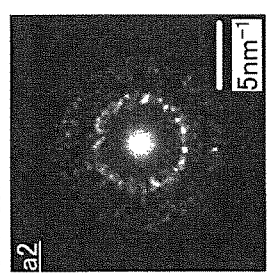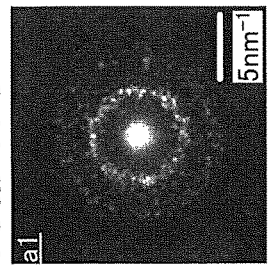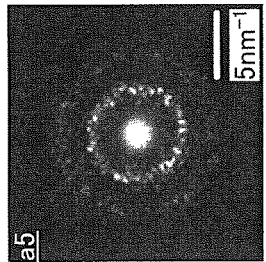

FIG. 19A1
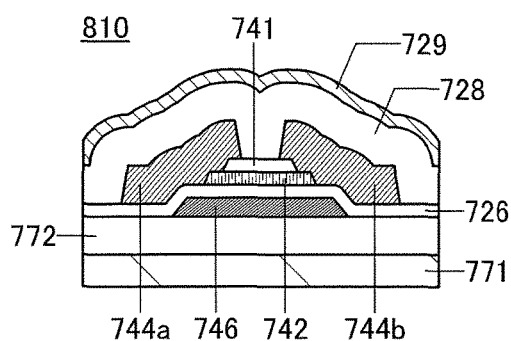
FIG. 19A2
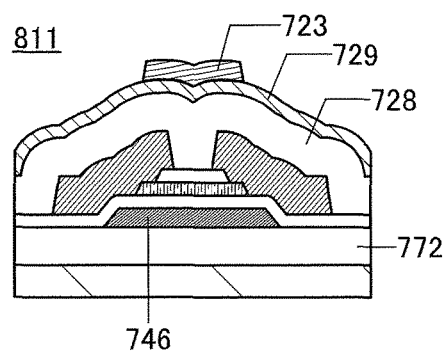
FIG. 19B1
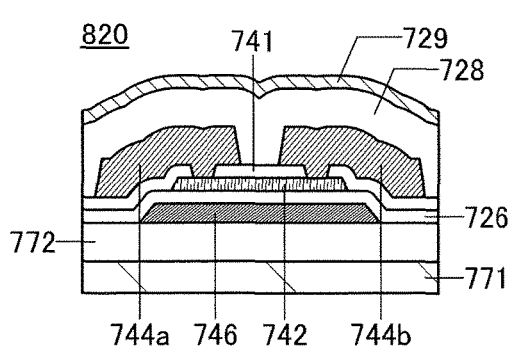
FIG. 19B2
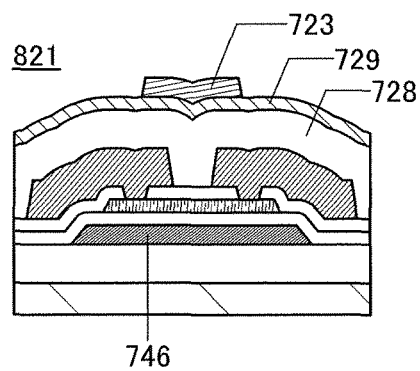
FIG. 19C1
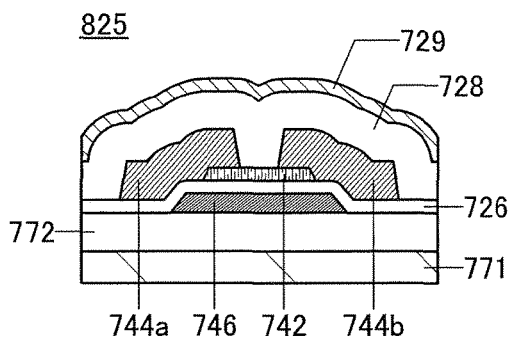
FIG. 19C2
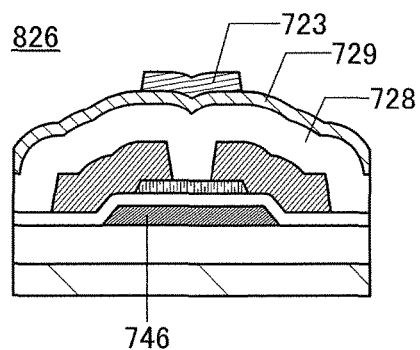

FIG. 20A1
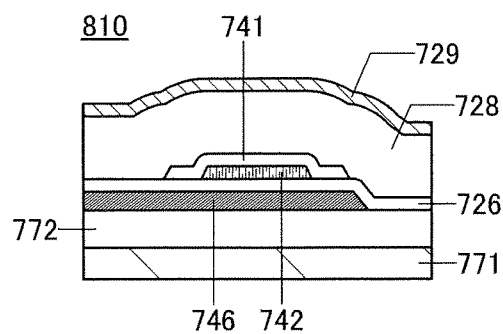
FIG. 20A2
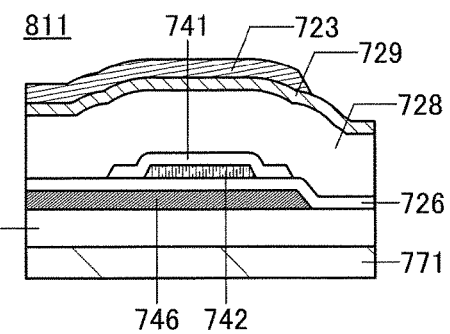
FIG. 20B1
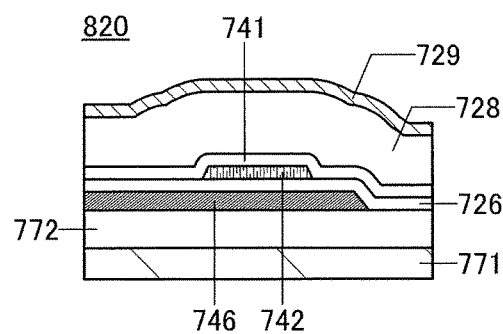
FIG. 20B2
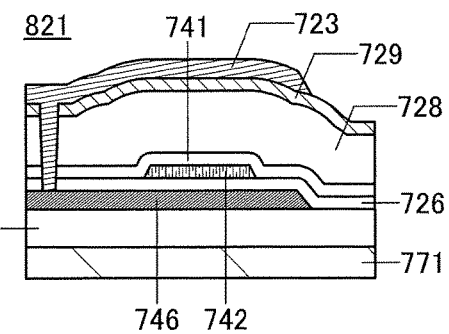
FIG. 20C1
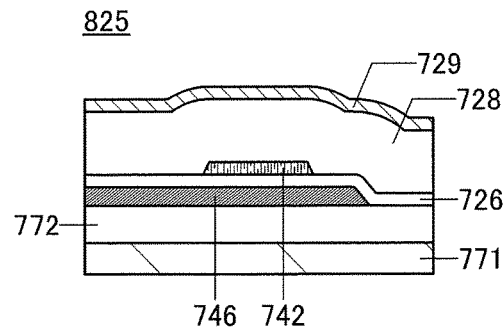
FIG. 20C2
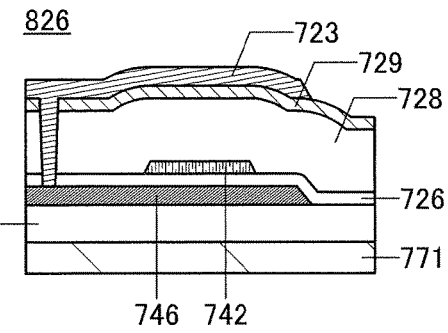

FIG. 21A1
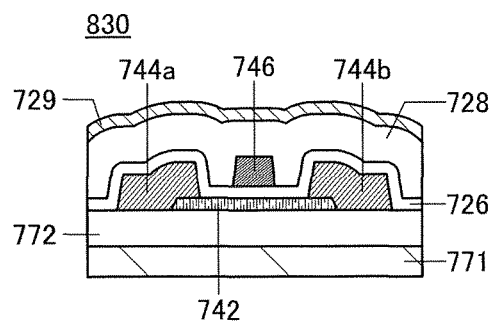
FIG. 21A2
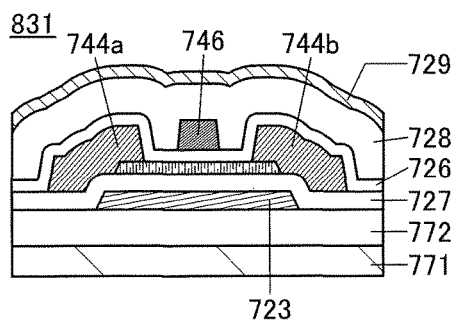
FIG. 21A3
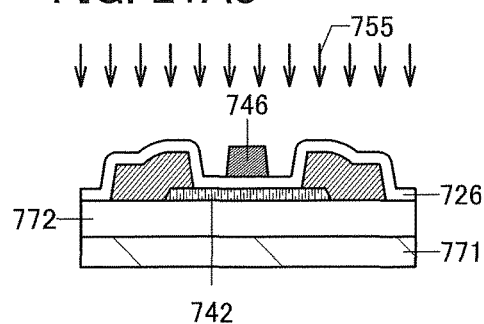
FIG. 21B1
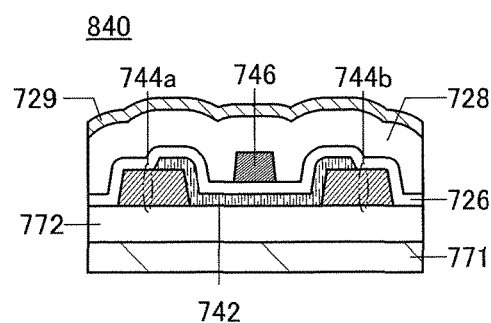
FIG. 21B2
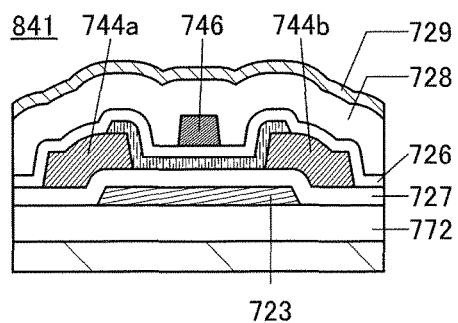

FIG. 22A1
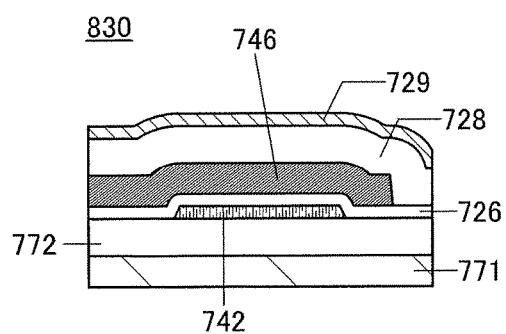
FIG. 22A2
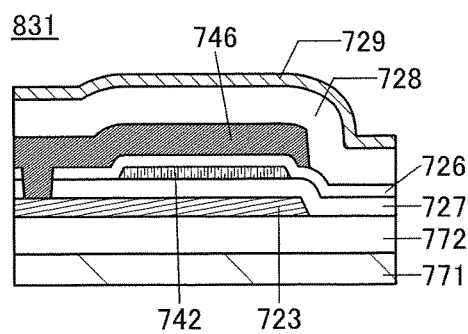
FIG. 22B1
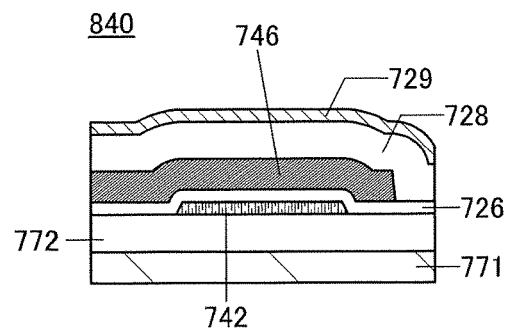
FIG. 22B2
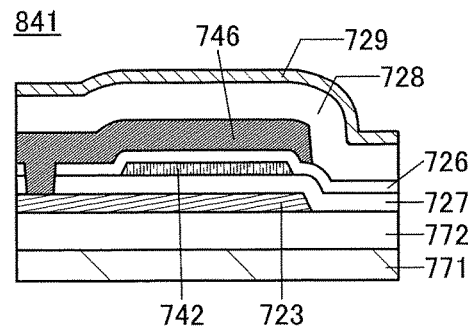

FIG. 23A1
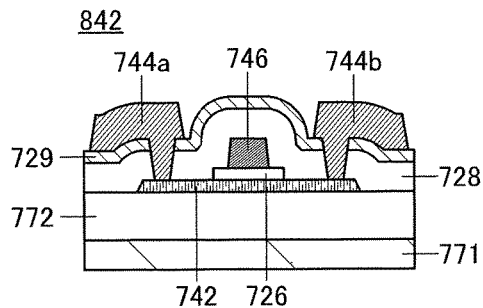
FIG. 23A2
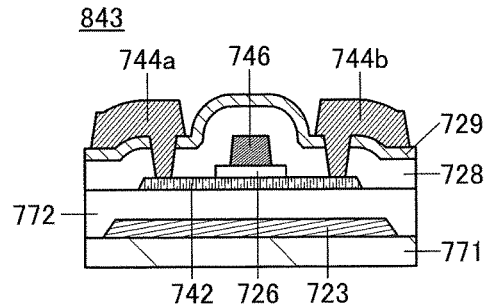
FIG. 23A3
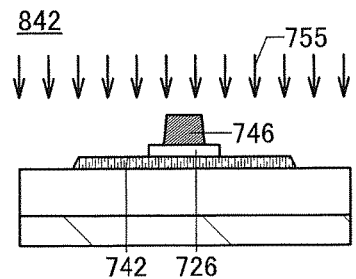
FIG. 23B1
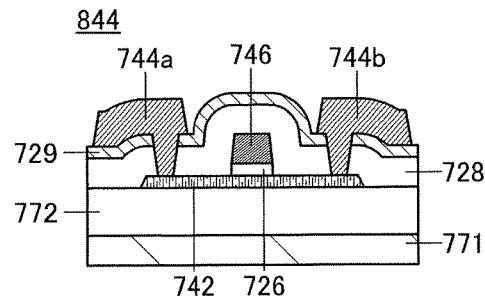
FIG. 23B2
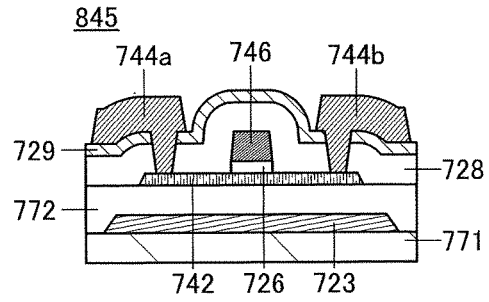
FIG. 23C1
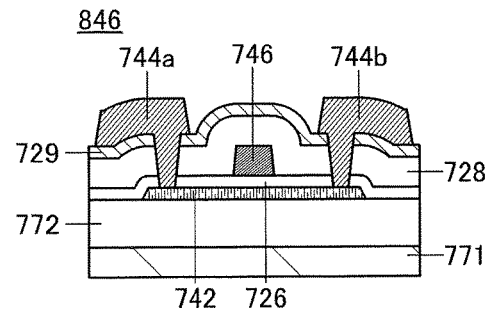
FIG. 23C2
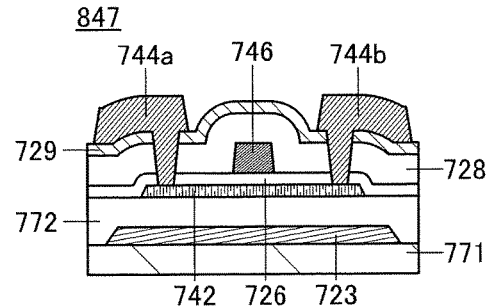

FIG. 24A1
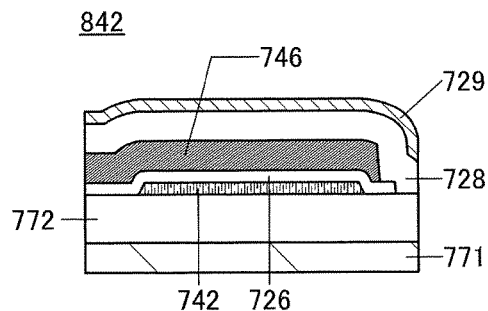
FIG. 24A2
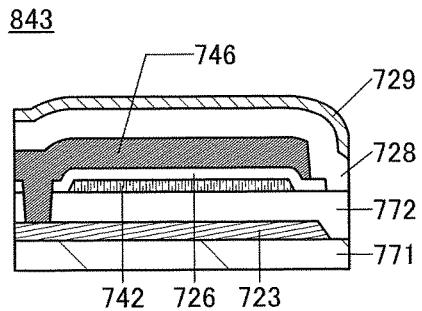
FIG. 24B1
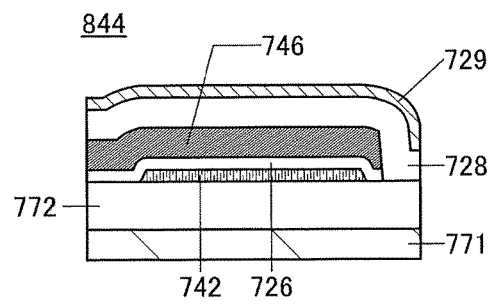
FIG. 24B2
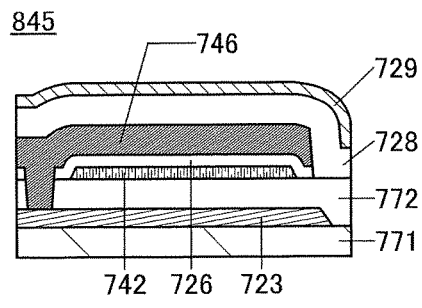
FIG. 24C1
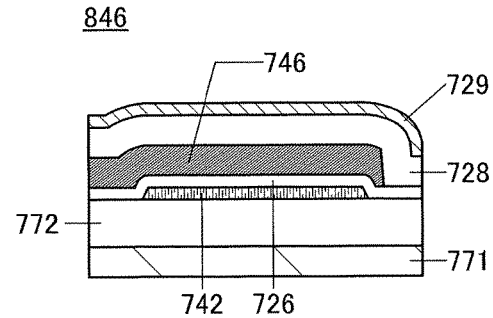
FIG. 24C2
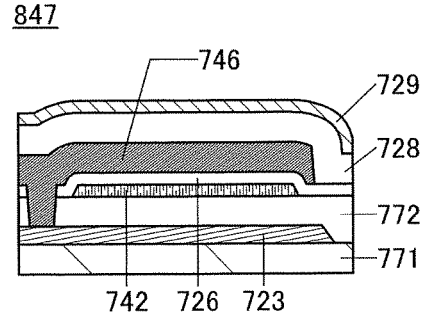

FIG. 25A1
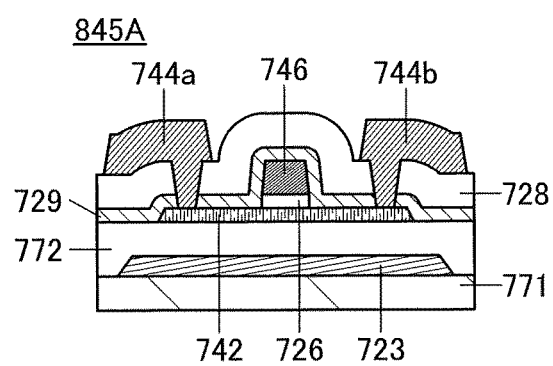
FIG. 25A2
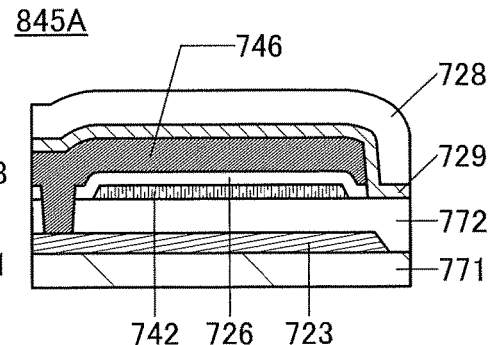

DISPLAY DEVICE AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device, a light-emitting device, a display device, an electronic device, a lighting device, a driving method thereof, or a manufacturing method thereof. In particular, one embodiment of the present invention relates to a display device (display panel) capable of displaying images on a curved surface. Another embodiment of the present invention relates to an electronic device, a light-emitting device, or a lighting device that includes a display device capable of displaying images on a curved surface, or a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. A light-emitting device, a display device, an electronic device, a lighting device, and an electronic device may include a semiconductor device.

2. Description of the Related Art

Recent widespread use of electronic devices such as smartphones and tablet terminals gives more and more opportunities for outdoor data communication. Furthermore, in the field of display devices included in electronic devices, techniques for reducing power consumption have been competitively developed to achieve long-time operation with a limited battery capacity. For example, Patent Document 1 discloses a low-power liquid crystal display device in which a transistor including an oxide semiconductor and having a low off-state current is used for a pixel so that an image signal is retained for a long time.

REFERENCE

Patent Document

[Patent Document 1] Japanese Published Patent Application No. 2011-141522

SUMMARY OF THE INVENTION

Transmissive liquid crystal elements with backlights as light sources or self-luminous organic electroluminescent (EL) elements are widely used in display devices of electronic devices. Such display elements offer an excellent visibility indoors; however, the visibility of light (display) exhibited from the inside of the display device decreases under strong light, e.g., outdoors in fine weather, because reflection of external light on the display surface increases in intensity under such strong light.

Thus, under strong light, it is preferable to use a reflective display element that utilizes reflection of external light. For example, a display device with a reflective liquid crystal element has a higher visibility when used in external light with a higher intensity. However, the display surface of the display device includes a glass substrate, a resin substrate, or the like that has a reflectance of several percent, and thus the influence of external light reflection on display still remains.

In addition, a reflective display element does not have an adequate visibility under low-intensity external light. Therefore, a transmissive liquid crystal element or a self-luminous organic EL element is preferably used in combination with the reflective display element so that an appropriate display element can be selected in accordance with a change in environment to display an image.

An object of one embodiment of the present invention is to provide a display device that has an excellent visibility even under strong light. Another object is to provide a display device that includes a display element having a function of emitting visible light and a display element having a function of reflecting visible light. Another object is to provide a low-power display device. Another object is to provide a novel display device. Another object is to provide a novel electronic device.

Note that the descriptions of these objects do not disturb the existence of other objects. In one embodiment of the present invention, there is no need to achieve all the objects. Objects other than the above objects will be apparent from and can be derived from the description of the specification and the like.

One embodiment of the present invention relates to a display device having a function of emitting visible light, a display device having a function of reflecting visible light, and a display device having a function of emitting visible light and a function of reflecting visible light. Furthermore, an embodiment of the present invention relates to an electronic device including the display device.

One embodiment of the present invention is a display device including a first substrate, a second substrate, a first display element, a second display element, an input device, and a driver circuit. The first substrate and the second substrate overlap with each other. The first display element and the second display element are between a first surface of the first substrate and a first surface of the second substrate. The first display element is configured to reflect visible light, and the second display element is configured to emit visible light. The input device is between the first surface of the second substrate and the first and second display elements. A second surface of the second substrate opposite to the first surface of the second substrate is provided with an anti-reflection layer. The first surface of the first substrate is provided with the driver circuit. The input device and the driver circuit are electrically connected to each other through an FPC.

The first display element and the second display element can be in the same pixel unit.

The driver circuit can be configured to drive the first display element, the second display element, and the input device.

The first surface of the second substrate may be provided with an anti-reflection layer.

The anti-reflection layer can be formed with a dielectric layer. Alternatively, the anti-reflection layer may have an anti-glare pattern.

The input device includes a wiring including a first layer provided for the first surface of the second substrate and a second layer in contact with the first layer. The first layer preferably contains a material whose reflectance is lower than that of the second layer.

A light diffusion plate and a polarizing plate are preferably between the input device and the first and second display elements.

Each of the first display element and the second display element is preferably electrically connected to a transistor whose semiconductor layer including a channel contains a metal oxide.

Note that in this specification, the display device includes any of the following modules in its category: a module in which a connector such as a flexible printed circuit (FPC) or a tape carrier package (TCP) is attached to a substrate over which a display element (display portion) is formed; a module having a TCP provided with a printed wiring board at the end thereof; and a module having an integrated circuit (IC) directly mounted by a chip on glass (COG) method on a substrate over which a display element is formed.

According to one embodiment of the present invention, a display device that has a high visibility even under strong light can be provided. A display device that includes a display element capable of emitting visible light and a display element capable of reflecting visible light can be provided. A display device with low power consumption can be provided. A novel display device can be provided. A novel electronic device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 8A illustrates a circuit of a display device and FIGS. 8B1 and 8B2 are top views of pixels.
FIGS. 17A and 17B are TEM images of samples and FIGS. 17C to 17L are electron diffraction patterns of the samples.
FIGS. 19A1, 19A2, 19B1, 19B2, 19C1, and 19C2 each illustrate a transistor.
FIGS. 20A1, 20A2, 20B1, 20B2, 20C1, and 20C2 each illustrate a transistor.
FIGS. 21A1, 21A2, 21A3, 21B1, and 21B2 each illustrate a transistor.
FIGS. 22A1, 22A2, 22B1, and 22B2 each illustrate a transistor.
FIGS. 23A1, 23A2, 23A3, 23B1, 23B2, 23C1, and 23C2 each illustrate a transistor.
FIGS. 24A1, 24A2, 24B1, 24B2, 24C1, and 24C2 each illustrate a transistor.
FIGS. 25A1 and 25A2 illustrate a transistor.

DETAILED DESCRIPTION OF THE INVENTION

Figure 1A:
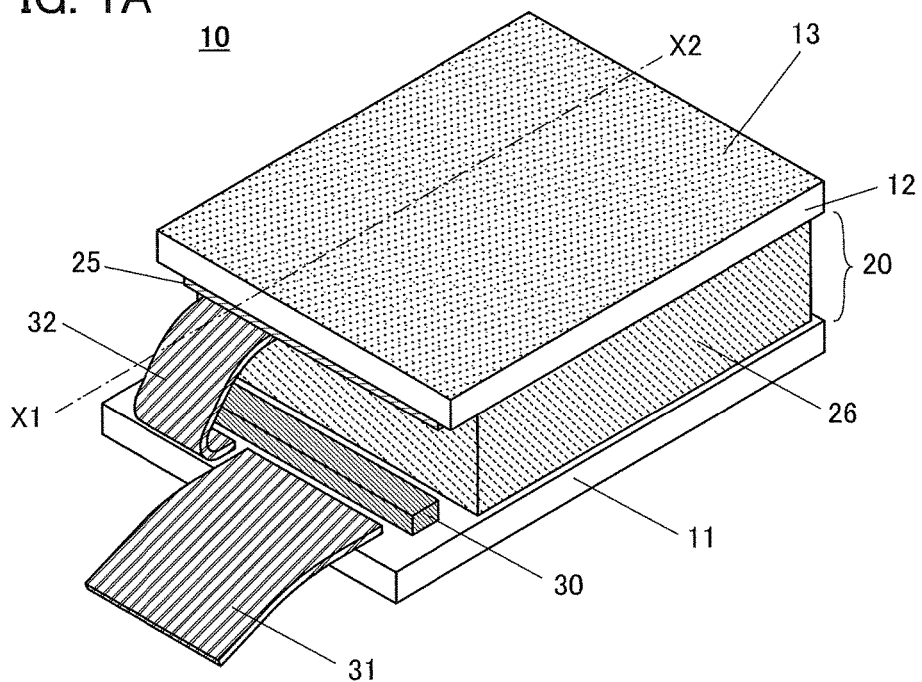
FIGS. 1A and 1B illustrate a display device.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

Embodiment 1

In this embodiment, a display device according to one embodiment of the present invention will be described with reference to drawings.

A display device of one embodiment of the present invention includes a first substrate, a second substrate, a first display element, a second display element, a touch sensor, and a driver circuit.

The first display element has a function of reflecting visible light. The second display element has a function of emitting visible light. Thus, the display device can display a highly visible image with low power consumption by, for example, operating the first display element under strong light and operating the second display element under weak light.

The first display element, the second display element, and the touch sensor are between the first substrate and the second substrate. A first surface of the second substrate is provided with the touch sensor, and a second surface opposite to the first surface is provided with an anti-reflection layer. Such a structure can sufficiently reduce reflection of external light on the display surface under strong light, further increasing the visibility.

FIG. 1A illustrates a display device of one embodiment of the present invention. A display device 10 in FIG. 1A includes a first substrate 11, a second substrate 12, a layer 20, a driver circuit 30, an FPC 31, and an FPC 32.

The first substrate 11 and the second substrate 12 are glass substrates, for example. Alternatively, they may be flexible resin substrates. Note that at least the second substrate 12 contains a light-transmitting material, because the second substrate 12 side of the display device 10 is a display side (viewing side).

A first surface and a second surface of the second substrate 12 each are, or the second surface is, provided with an anti-reflection layer 13. The anti-reflection layer 13 may have a structure of, for example, any of layers 13a to 13d shown in FIGS. 2A to 2F.

Figure 2A:
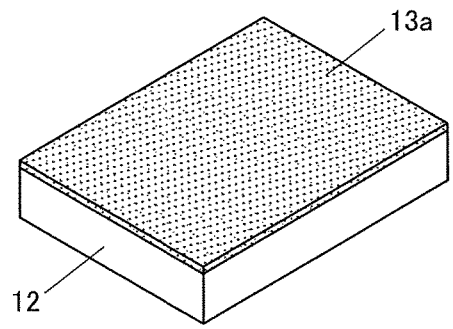
FIGS. 2A to 2F each illustrate an anti-reflection layer.

FIG. 2A shows an example where the second surface of the second substrate 12, which is a top surface of the display device 10, is provided with a dielectric layer 13a having a light-transmitting property. The dielectric layer 13a is a multi-layer dielectric layer with an appropriate thickness; accordingly, light reflection can be reduced by a light interference effect. The reflectance of a surface of the glass substrate is approximately 4% to 5%; the reflectance can be reduced to approximately 0.05% to 0.5% by providing the light-transmitting dielectric layer 13a for the second surface of the second substrate 12.

Figure 2B:
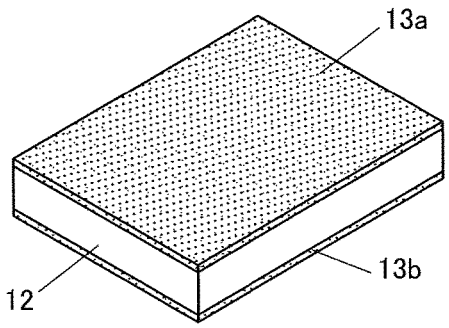

When the first surface of the second substrate 12 is also provided with a dielectric layer 13b having a light-transmitting property as shown in FIG. 2B, the reflectance of the rear surface of the glass substrate can be reduced. In that case, the reflectance of the front and rear surfaces of the second substrate 12 can be reduced to approximately 0.1% to 1.0%. Therefore, glare of external light can be reduced and display visibility can be improved.

Figure 2C:
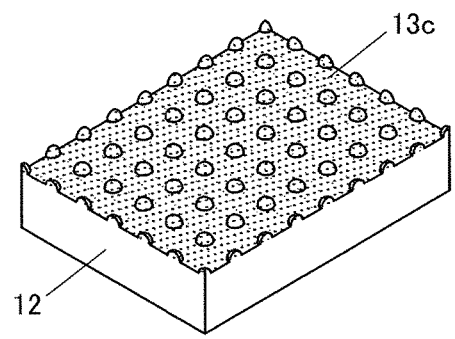
Figure 2D:
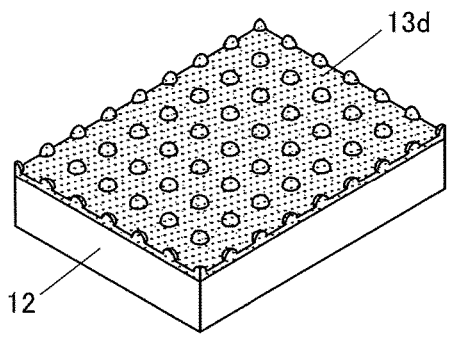

Alternatively, as shown in FIG. 2C, the second surface of the second substrate 12 may have an anti-glare pattern 13c with minute projections. The anti-glare pattern 13c can scatter reflected light; thus, the visibility of display by a reflective display element can increase. In addition, the anti-glare pattern 13c can reduce attachment of smudges such as fingerprints. Although the example of FIG. 2C shows that the anti-glare pattern 13c is formed by processing the second surface of the second substrate 12, a film 13d having an anti-glare pattern may be attached to the second surface of the second substrate 12 as shown in FIG. 2D.

Figure 2E:
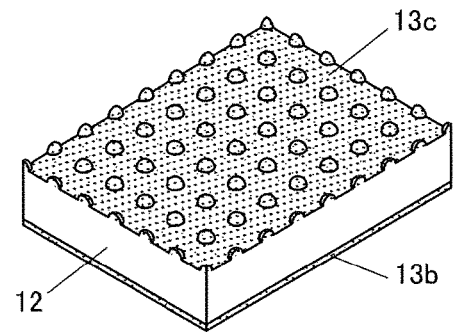
Figure 2F:
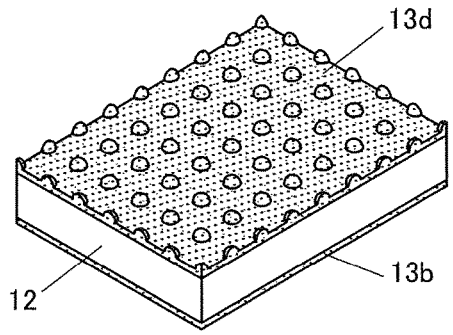

Alternatively, the anti-glare pattern 13c and the dielectric layer 13b may be used in combination as shown in FIG. 2E. Alternatively, the film 13d having an anti-glare pattern and the dielectric layer 13b may be used in combination as shown in FIG. 2F.

Figure 1B:
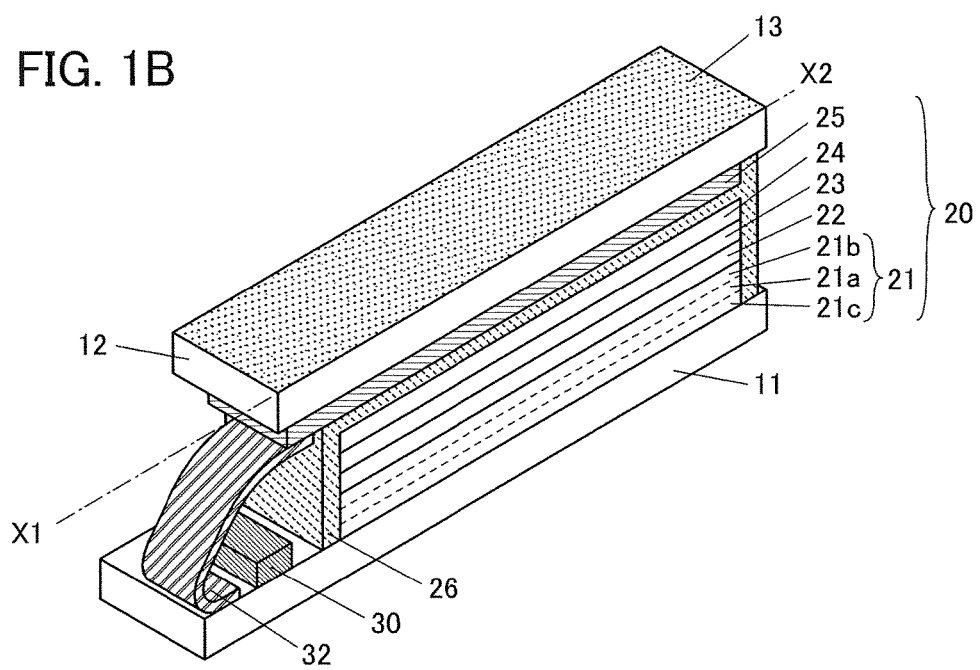

The layer 20 is between the first substrate 11 and the second substrate 12. The layer 20 is described with reference to FIG. 1B. FIG. 1B corresponds to a cross section along line X1-X2 in FIG. 1A. The layer 20 includes an element layer 21, a substrate 22, a light diffusion plate 23, a polarizing plate 24, a touch sensor 25, and an adhesive layer 26.

The element layer 21 includes an FET layer 21a, an LC layer 21b, and an OLED layer 21c. The FET layer 21a includes, for example, a transistor constituting a pixel circuit. The LC layer 21b includes the first display element. The OLED layer 21c includes the second display element. The first and second display elements are electrically connected to transistors in the FET layer 21a.

The first display element is, for example, a reflective liquid crystal element. The second display element is, for example, a light-emitting element. The reflective liquid crystal element consumes a low amount of power, and can perform display with high visibility even under sunlight in fine weather. The light-emitting element can perform display with high visibility under indoor light, outdoor light in cloudy weather, or the like.

The substrate 22 has a function of sealing a liquid crystal layer included in the first display element. The substrate 22 can be a glass substrate or a resin substrate such as a film, for example.

The light diffusion plate 23 has a function of diffusing light reflected on a reflective electrode of the liquid crystal element. Such a function allows the reflective liquid crystal element to exhibit a natural color and display a white color close to that of white paper.

The polarizing plate 24 is, for example, a circularly polarizing plate. Change in deflection angle owing to the circularly polarizing plate and the liquid crystal is utilized to enable display with reflected light.

The touch sensor 25 is, for example, a capacitive touch sensor. The touch sensor 25 is an input device, and overlaps with a display portion. The touch sensor 25 has a function of converting a touch to the display portion by a user into an electric signal and outputting the signal.

Figure 3:
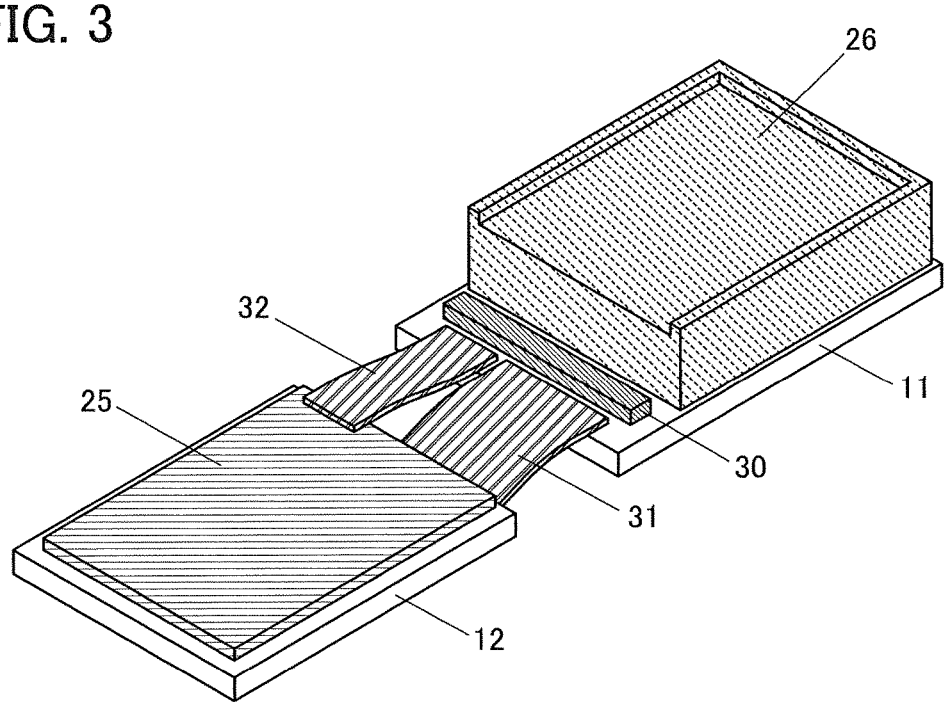
FIG. 3 illustrates a display device.

The touch sensor 25 is provided for the first surface of the second substrate 12 as shown in FIG. 3. Alternatively, the touch sensor 25 may be provided for the above-mentioned dielectric layer 13b. In the case of a capacitive touch sensor, its wiring and electrode may employ a light-transmitting conductive film, but preferably employ a metal mesh that has a lower resistance than the light-transmitting conductive film and is available for a large-size display device. A metal, typically having a high reflectance, can have a dark color through oxidation treatment or the like. Thus, even when the touch sensor 25 is provided for the first surface of the second substrate 12, reflection of external light can be reduced.

The touch sensor 25 is an external touch sensor, and overlaps with the first and second display elements with the visible light-transmitting adhesive layer 26 between the touch sensor 25 and the first and second display elements. The touch sensor 25 can be manufactured separately from the manufacturing process for the first and second display elements; therefore, the yield of each component can be improved.

The driver circuit 30 has a function as a source driver that supplies image data to the first and second display elements, and may have a function of controlling the touch sensor 25. An IC chip formed with a silicon wafer can be mounted as the driver circuit 30. Alternatively, the driver circuit 30 may be formed with transistors over the first substrate 11.

Although FIGS. 1A and 1B and FIG. 3 show an embodiment where a bare chip as the driver circuit 30 is mounted by the COG method, the bare chip may be provided by the TCP method or the COF method.

The driver circuit 30 is electrically connected through the FPC 31 to, for example, a circuit that supplies image data. The touch sensor 25 is electrically connected through the FPC 32 to the driver circuit 30.

FIGS. 4A to 4D each illustrate electrical connection among the driver circuit 30, the FPC 31, and the FPC 32.

Figure 4A:
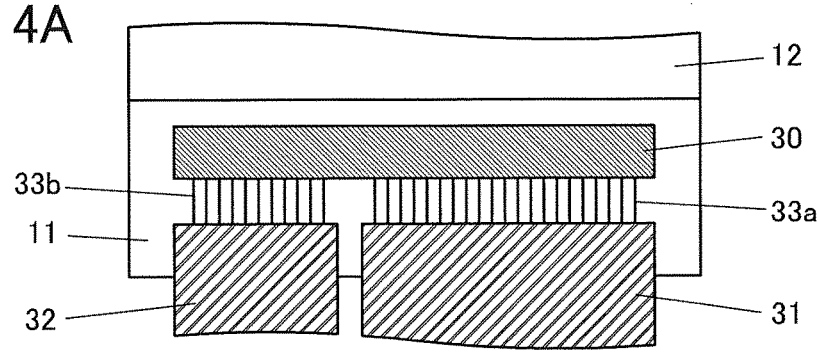
FIGS. 4A to 4D each illustrate an example of connection between a driver circuit and an FPC.

FIG. 4A shows an example where the driver circuit 30 has a function as a source driver that supplies image data to the first and second display elements and a function of controlling the touch sensor 25. Here, the driver circuit 30 is electrically connected to the FPC 31 through a wiring 33a. In addition, the driver circuit 30 is electrically connected to the FPC 32 through a wiring 33b.

Figure 4B:
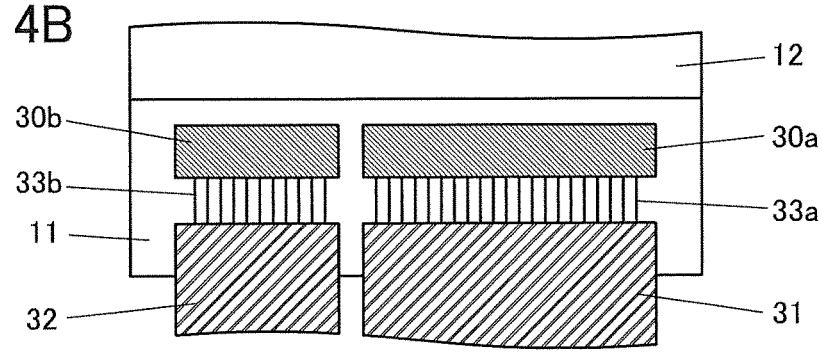

FIG. 4B shows an example where the driver circuit 30 is divided into two parts. Here, a driver circuit 30a has a function as a source driver that supplies image data to the first and second display elements. A driver circuit 30b has a function of controlling the touch sensor 25. The driver circuit 30a is electrically connected to the FPC 31 through the wiring 33a. The driver circuit 30b is electrically connected to the FPC 32 through the wiring 33b.

Figure 4C:
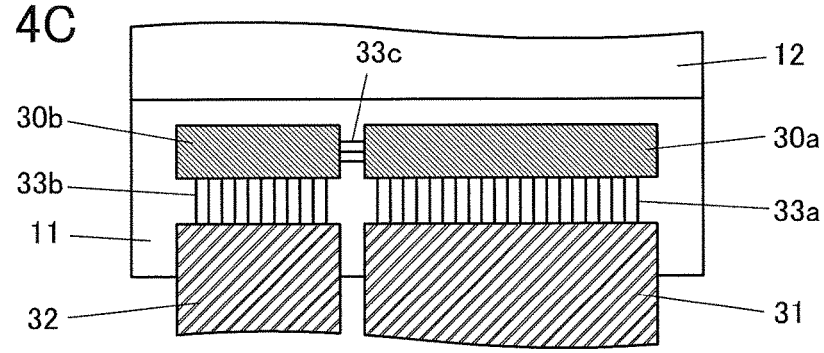
Figure 4D:
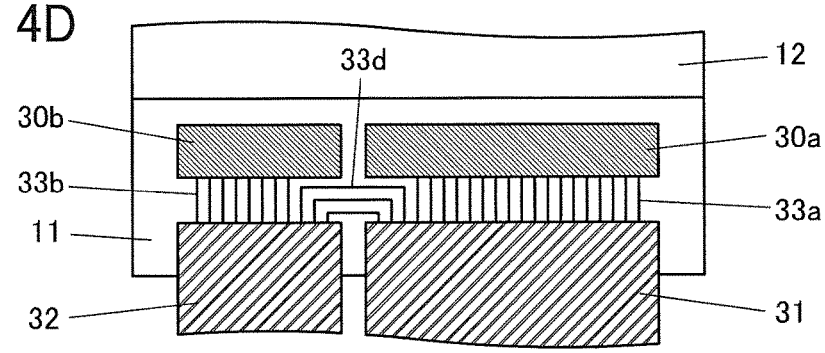

As shown in FIG. 4C, the driver circuits 30a and 30b may be electrically connected to each other through a wiring 33c. As shown in FIG. 4D, the FPCs 31 and 32 may be electrically connected to each other through a wiring 33d. Such a structure enables a reduction in the number of wirings for supplying a power source voltage or a signal.

A transistor in the FET layer 21a is preferably a transistor whose channel region includes a metal oxide (such a transistor is hereinafter referred to as an OS transistor). An OS transistor has an extremely low off-state current, with which a potential written as image data can be retained for a long time. The use of an OS transistor enables what is called idling stop driving by which image display can be maintained for a plurality of frame periods without rewriting of image data.

The idling stop driving enables retention of image data written in a pixel for two or more frames. This reduces the frequency of image data rewriting and thus lowers power consumption.

The reflective liquid crystal element that can be used as the first display element does not need a backlight, and accordingly the power consumption in the pixel portion is equivalent to the power consumption by circuit operations. Thus, a pixel with the first display element is particularly preferable to be subjected to the idling stop driving. In that case, the power consumption in the pixel portion can decrease in proportion to the rewriting frequency.

An example of the above-mentioned idling stop driving will be described with reference to FIGS. 5A to 5C.

Figure 5A:
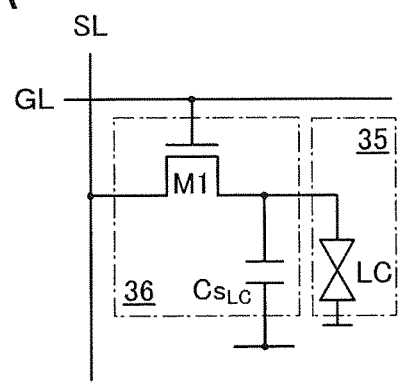
FIGS. 5A to 5C illustrate idling stop driving.

FIG. 5A is a circuit diagram of a pixel including a liquid crystal element 35 and a pixel circuit 36. FIG. 5A illustrates a transistor M1 connected to a signal line SL and a gate line GL, a capacitor $Cs_{LC}$, and a liquid crystal element LC.

Figure 5B:
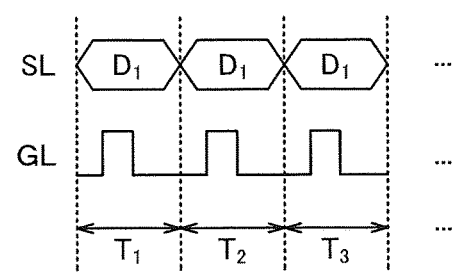

FIG. 5B is a timing chart showing waveforms of signals supplied to the signal line SL and the gate line GL in a normal driving mode that does not perform the idling stop driving. In the normal driving mode, a normal frame frequency (e.g., 60 Hz) can be used for operation.

The frame frequency includes successive frame periods $T_1$, $T_2$, and $T_3$. In each of the frame periods, a scan signal is supplied to the gate line and data $D_1$ of the signal line is written to the pixel. This operation is performed both to write the same data $D_1$ in the periods $T_1$ to $T_3$ and to write different data in the periods $T_1$ to $T_3$.

Figure 5C:
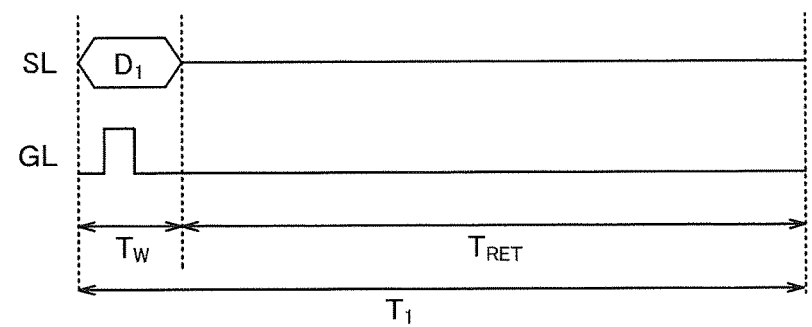

FIG. 5C is a timing chart showing waveforms of signals supplied to the signal line SL and the gate line GL in the idling stop driving. In the idling stop driving, a low frame frequency (e.g., 1 Hz) can be used for operation.

FIG. 5C shows a frame period $T_1$ in the frame frequency, which includes a period $T_W$ for writing data and a period $T_{RET}$ for retaining data. The idling stop driving is performed as follows: in the period $T_W$, a scan signal is supplied to the gate line and the data $D_1$ of the signal line is written to the pixel, and in the period $T_{RET}$, the gate line is fixed to a low-level voltage so that the transistor M1 is off and the written data $D_1$ is retained in the pixel.

The use of an OS transistor as the transistor M1 enables retention of the data $D_1$ for a long time, owing to its low off-state current. Although FIGS. 5A to 5C show the example where the liquid crystal element LC is used, the idling stop driving is available even when a light-emitting element such as an organic EL element is used.

In the circuit diagram illustrated in FIG. 5A, the liquid crystal element LC might serve as a leakage path of data $D_1$. Therefore, to perform the idling stop driving appropriately, the resistivity of the liquid crystal element LC is preferably higher than or equal to $1.0 \times 10^{14} \Omega \cdot cm$.

As the metal oxide used for the above-mentioned transistor, a cloud-aligned composite oxide semiconductor (CAC-OS) described later can be used, for example.

In particular, an oxide semiconductor having a wider band gap than silicon is preferably used. When a semiconductor material having a wider band gap and a lower carrier density than silicon is used, the off-state current of the transistor can be reduced.

Charge accumulated in a capacitor through the transistor can be retained for a long time because of the low off-state current of the transistor. The use of such a transistor in pixels allows a driver circuit to stop while the gray level of an image displayed in display regions is maintained. As a result, an electronic device with extremely low power consumption can be obtained.

A semiconductor device such as a transistor used in the above-mentioned pixel or circuit for driving the pixel may include a polycrystalline semiconductor. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even when a very large number of pixels are provided, a gate driver circuit and a source driver circuit can be formed over a substrate where the pixels are formed, so that the number of components of an electronic device can be reduced.

The display device with the above-mentioned structure can display an image with high visibility regardless of the intensity of external light. The display device can have high visibility under strong light and operate with low power consumption, which is particularly advantageous.

At least part of this embodiment can be implemented in combination with any of the other embodiments and the other examples described in this specification as appropriate.

Embodiment 2

This embodiment will describe a display device and a driving method of the display device of one embodiment of the present invention.

The display device of one embodiment of the present invention can include a pixel in which the first display element that reflects visible light is provided. Alternatively, the display device can include a pixel in which the second display element that emits visible light is provided. Alternatively, the display device can include a pixel in which the first and second display elements are provided.

In this embodiment, a display device including the first display element that reflects visible light and the second display element that emits visible light is described.

The display device has a function of displaying an image with the use of one or both of first light reflected by the first display element and second light emitted by the second display element. Alternatively, the display device has a function of expressing gray scales by individually controlling the amount of first light reflected by the first display element and the amount of second light emitted by the second display element.

It is preferable that the display device have a structure including a first pixel expressing gray scales by controlling the amount of light reflected by the first display element and a second pixel expressing gray scales by controlling the amount of light emitted by the second display element. The first pixels are arranged in a matrix and the second pixels are arranged in a matrix to form a display portion, for example.

The number of the first pixels is preferably the same as that of the second pixels, and the first pixels and the second pixels are preferably arranged in a display region with the same pitch. Here, the first pixel and the second pixel adjacent to each other can be collectively referred to as a pixel unit. Thus, as described later, an image displayed only by a plurality of first pixels, an image displayed only by a plurality of second pixels, and an image displayed by both the plurality of first pixels and the plurality of second pixels can be displayed in the same display region.

As the first display element included in the first pixel, an element that performs display by reflecting external light can be used. Such an element does not include a light source and thus power consumption in display can be significantly reduced.

As the first display element, a reflective liquid crystal element can be typically used. Alternatively, the first display element can be, for example, a Micro Electro Mechanical Systems (MEMS) shutter element, an optical interference MEMS element, or an element using a microcapsule method, an electrophoretic method, an electrowetting method, an Electronic Liquid Powder (registered trademark) method, or the like.

As the second display element included in the second pixel, an element that performs display with the use of light from a light source in the element can be used. Specifically, it is preferable to use an electroluminescence element where light can be extracted from a light-emitting substance by application of an electric field. Since the luminance and the chromaticity of light emitted from such a pixel are not affected by external light, an image with high color reproducibility (a wide color gamut) and a high contrast, i.e., a clear image, can be displayed.

The second display element can be a self-luminous light-emitting element such as an organic light-emitting diode (OLED), a light-emitting diode (LED), a quantum-dot light-emitting diode (QLED), or a semiconductor laser. Alternatively, the display element in the second pixel may be formed by a combination of a backlight that is a light source and a transmissive liquid crystal element that controls the amount of light transmitted from the backlight.

The first pixel can include, for example, a subpixel exhibiting light of white (W), or subpixels exhibiting light of three colors of red (R), green (G), and blue (B). Similarly, the second pixel can include, for example, a subpixel exhibiting light of white (W), or subpixels exhibiting light of three colors of red (R), green (G), and blue (B). Note that the first pixel and the second pixel may each include subpixels of four colors or more. The increased number of subpixels leads to a reduction in power consumption and improvement in color reproducibility.

One embodiment of the present invention can switch between a first mode in which an image is displayed by the first pixels, a second mode in which an image is displayed by the second pixels, and a third mode in which an image is displayed by the first pixels and the second pixels. In addition, different image signals can be input to the first and second pixels to display a composite image.

The first mode is a mode in which an image is displayed utilizing light reflected from the first display element. The first mode does not require a light source and thus is a driving mode with extremely low power consumption. The first mode is effective in the case where, for example, external light has a sufficiently high illuminance and is white light or light near white light. The first mode is a display mode appropriate for displaying text data of a book or a document, for example. The use of reflected light enables eye-friendly display, thereby mitigating eye fatigue.

The second mode is a mode in which an image is displayed utilizing light emitted from the second display element. Thus, an extremely clear image (with high contrast and high color reproducibility) can be displayed regardless of the illuminance and chromaticity of external light. For example, the second mode is effective in the case where the illuminance of external light is extremely low, e.g., during the night or in a dark room. When a bright image is displayed under weak external light, a user may feel that the image is too bright. To prevent this, an image is preferably displayed with a reduced luminance in the second mode. This prevents too bright display and reduces power consumption. The second mode is a mode suitable for displaying a clear image and a smooth moving image.

The third mode is a mode in which an image is displayed utilizing both light reflected from the first display element and light emitted from the second display element. Specifically, the display device is driven in such a way that light casted by the first pixel and light emitted by the second pixel adjacent to the first pixel are mixed to express one color. The third mode can offer clearer image display than the first mode and consume lower power than the second mode. For example, the third mode is effective when the illuminance of external light is relatively low, e.g., under indoor illumination or in the morning or evening, or when the external light does not represent a white chromaticity.

A more specific example of one embodiment of the present invention will be described below with reference to drawings.

Structure Example of Display Device

Figure 6:
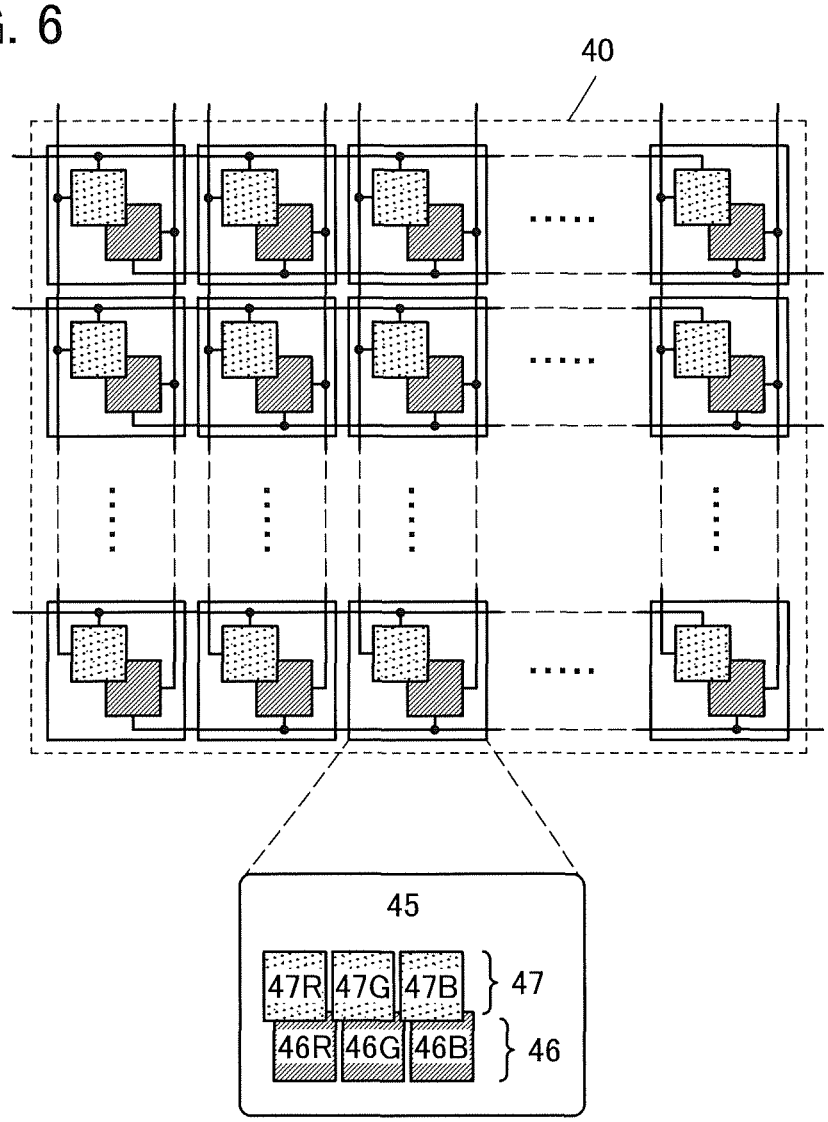
FIG. 6 illustrates pixel units.

FIG. 6 illustrates a pixel array 40 included in the display device of one embodiment of the present invention. The pixel array 40 includes a plurality of pixel units 45 arranged in a matrix. The pixel unit 45 includes a pixel 46 and a pixel 47.

FIG. 6 shows an example where the pixel 46 and the pixel 47 each include display elements corresponding to three colors of red (R), green (G), and blue (B).

The pixel 46 includes a display element 46R corresponding to red (R), a display element 46G corresponding to green (G), and a display element 46B corresponding to blue (B). The display elements 46R, 46G, and 46B are each the second display element that utilizes light from a light source.

The pixel 47 includes a display element 47R corresponding to red (R), a display element 47G corresponding to green (G), and a display element 47B corresponding to blue (B). The display elements 47R, 47G, and 47B are each the first display element that utilizes reflection of external light.

That is the description of the structure example of the display device.

Structure Example of Pixel Unit

Figure 7A:
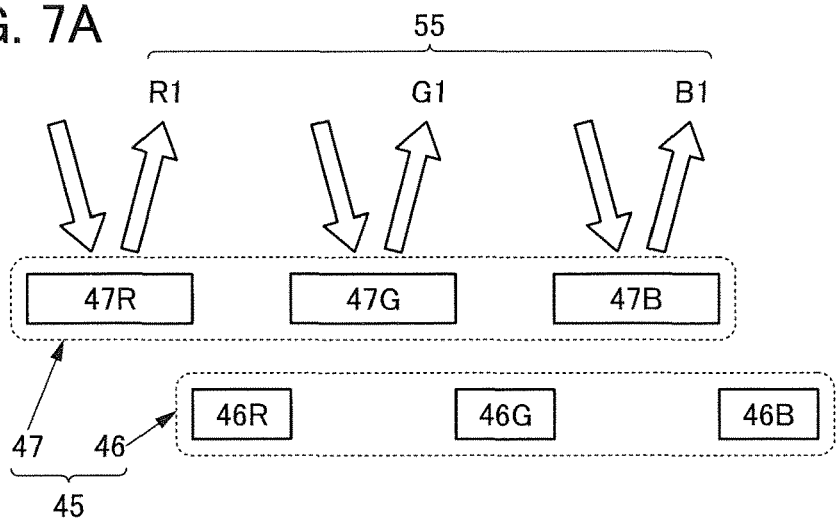
FIGS. 7A to 7C illustrate a pixel unit.
Figure 7B:
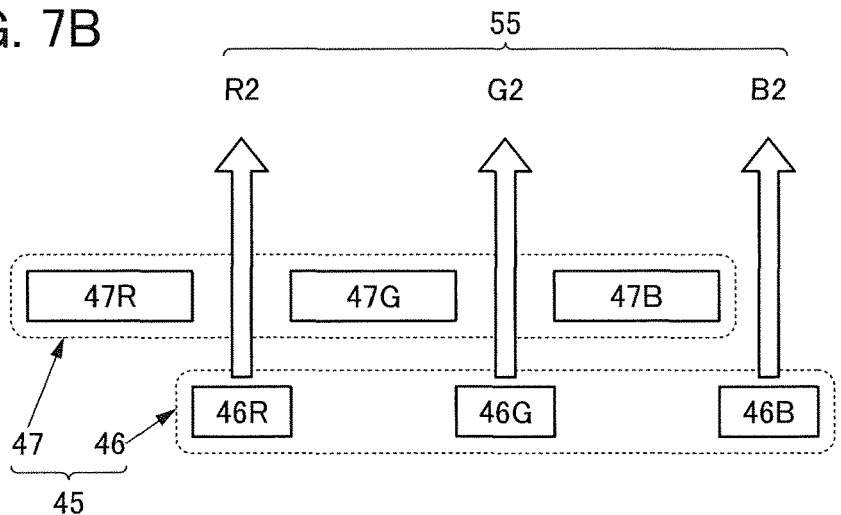
Figure 7C:
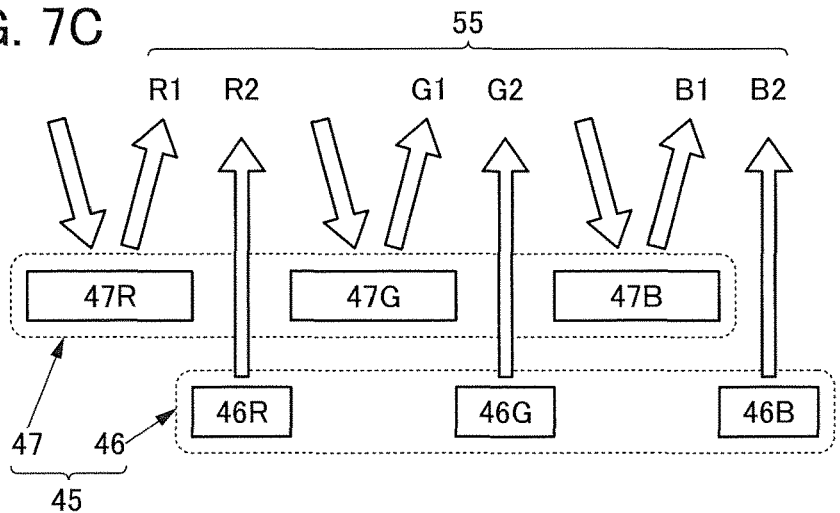

Next, the pixel unit 45 is explained with reference to FIGS. 7A to 7C. FIGS. 7A to 7C are schematic views illustrating a structure example of the pixel unit 45.

The pixel 46 includes the display elements 46R, 46G, and 46B. The display element 46R includes a light source and emits red light R2 to the display surface side; the red light R2 has a luminance according to a gray level corresponding to a red color included in a second gray level input to the pixel 46. Similarly, the display element 46G and the display element 46B emit green light G2 and blue light B2, respectively, to the display surface side.

The pixel 47 includes the display elements 47R, 47G, and 47B. The display element 47R reflects external light and casts red light R1 to the display surface side; the red light R1 has a luminance according to a gray level corresponding to a red color included in a first gray level input to the pixel 47. Similarly, the display element 47G and the display element 47B cast green light G1 and blue light B1, respectively, to the display surface side.

[First Mode]

FIG. 7A illustrates an example of an operation mode in which the display elements 47R, 47G, and 47B that reflect external light are driven to display an image. In the case where, for example, the illuminance of external light is sufficiently high, the pixel unit 45 does not drive the pixel 46 and mixes only light (the light R1, the light G1, and the light B1) from the pixel 47 to generate light 55 of a predetermined color that is casted to the display surface side, as illustrated in FIG. 7A. Thus, driving with extremely low power consumption can be performed.

[Second Mode]

FIG. 7B illustrates an example of an operation mode in which the display elements 46R, 46G, and 46B are driven to display an image. In the case where, for example, the illuminance of external light is extremely low, the pixel unit 45 does not drive the pixel 47 and mixes only light (the light R2, the light G2, and the light B2) from the pixel 46 to generate the light 55 of a predetermined color that is emitted to the display surface side, as illustrated in FIG. 7B. Accordingly, a clear image can be displayed. The luminance is lowered when the illuminance of external light is low, which can prevent a user from feeling dazzle and reduce power consumption.

[Third Mode]

FIG. 7C illustrates an example of an operation mode in which the display elements 47R, 47G, and 47B that reflect external light and the display elements 46R, 46G, and 46B that emit light are driven together to display an image. As illustrated in FIG. 7C, the pixel unit 45 can mix light of six colors, that is, the light R1, G1, B1, R2, G2, and B2, to generate the light 55 of a predetermined color that is casted to the display surface side.

The above is the description of the structure example of the pixel unit 45.

At least part of this embodiment can be implemented in combination with any of the other embodiments and the other examples described in this specification as appropriate.

Embodiment 3

An example of a display panel that can be used for the display device of one embodiment of the present invention is described below. The display panel described below as an example includes both a reflective liquid crystal element and a light-emitting element and can display an image in both a transmissive mode and a reflective mode.

Structure Example

FIG. 8A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes a plurality of wirings S1 and a plurality of wirings S2, which are electrically connected to the circuit SD and the plurality of pixels 410 arranged in a direction C.

Although the display device includes one circuit GD and one circuit SD here for simplification, the circuits GD and SD for driving a liquid crystal element and the circuits GD and SD for driving a light-emitting element may be provided separately.

The pixel 410 includes a reflective liquid crystal element and a light-emitting element. In the pixel 410, the liquid crystal element and the light emitting element overlap with each other.

FIG. 8B1 illustrates a structure example of a conductive layer 311b included in the pixel 410. The conductive layer 311b serves as a reflective electrode of the liquid crystal element in the pixel 410. The conductive layer 311b has an opening 451.

In FIG. 8B1, a light-emitting element 360 in a region overlapping with the conductive layer 311b is denoted by a dashed line. The light-emitting element 360 overlaps with the opening 451 of the conductive layer 311b. Thus, light from the light-emitting element 360 is emitted to a display surface side through the opening 451.

In FIG. 8B1, the pixels 410 adjacent in the direction R correspond to different colors. As illustrated in FIG. 8B1, the openings 451 are preferably provided in different positions in the conductive layers 311b of the two pixels adjacent in the direction R so as not to be aligned in one line. This allows the two adjacent light-emitting elements 360 to be apart from each other, thereby preventing light emitted by the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 8B2 may be employed.

If the ratio of the total area of the opening 451 to the total area except for the opening is too large, display performed with the liquid crystal element will be dark. If the ratio of the total area of the opening 451 to the total area except for the opening is too small, display performed with the light-emitting element 360 will be dark.

If the area of the opening 451 in the conductive layer 311b serving as a reflective electrode is too small, light emitted from the light-emitting element 360 cannot be efficiently extracted.

The shape of the opening 451 can be, for example, polygonal, quadrangular, elliptical, circular, or cross-shaped. Alternatively, the opening 451 may have a stripe shape, a slit shape, or a checkered pattern. The opening 451 may be provided close to the adjacent pixel. Preferably, the opening 451 is provided close to another pixel emitting light of the same color as that exhibited by the pixel including the opening 451, in which case crosstalk can be suppressed.

Circuit Structure Example

Figure 9:
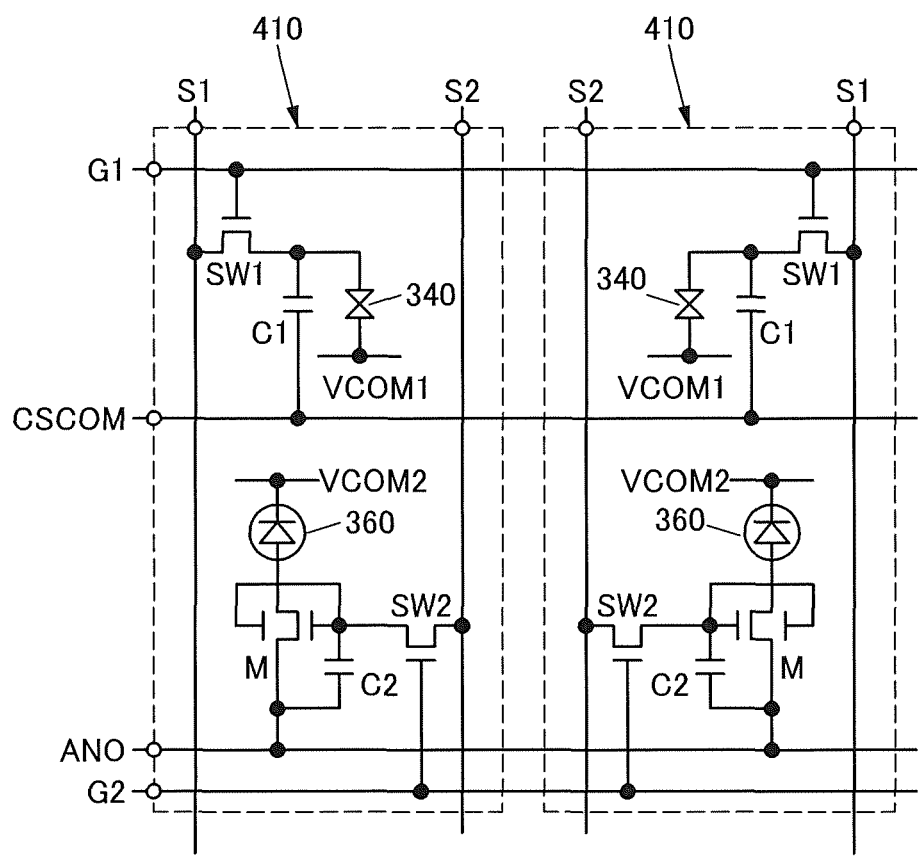
FIG. 9 illustrates a circuit of a display device.

FIG. 9 is a circuit diagram illustrating a structure example of the pixel 410. FIG. 9 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 9 illustrates a wiring VCOM1 electrically connected to the liquid crystal element 340 and a wiring VCOM2 electrically connected to the light-emitting element 360.

FIG. 9 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 9 illustrates an example in which the transistor M includes two gates between which a semiconductor is present and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the alignment state of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

For example, in the reflective mode, the pixel 410 of FIG. 9 can be driven with the signals supplied to the wirings G1 and S1 to display an image with the use of the optical modulation of the liquid crystal element 340. In the transmissive mode, the pixel can be driven with the signals supplied to the wirings G2 and S2 to display an image with the use of emission by the light-emitting element 360. In the case where both modes are performed at the same time, the pixel can be driven with the signals to the wiring G1, the wiring G2, the wiring S1, and the wiring S2.

Figure 10A:
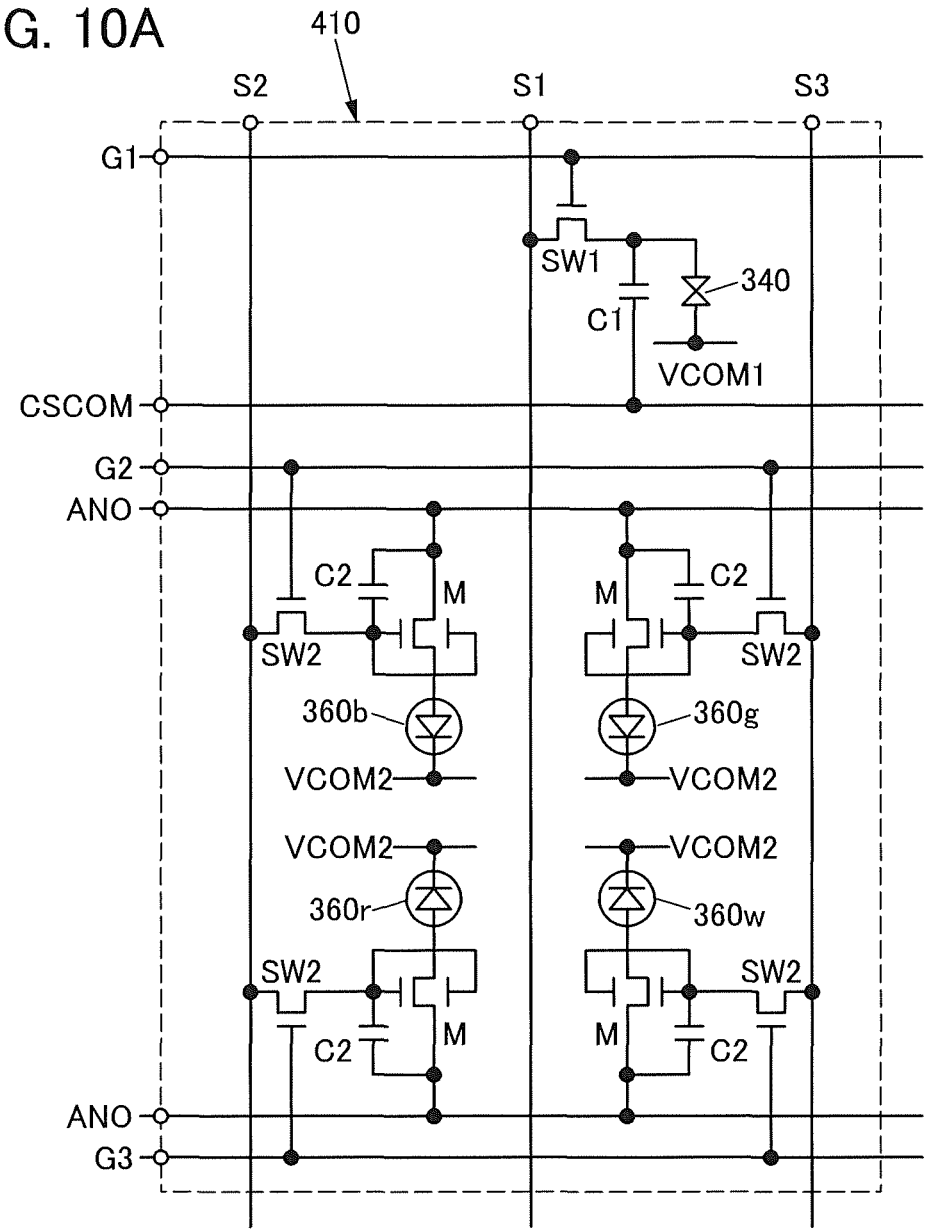
FIG. 10A illustrates a circuit of a display device.

Although FIG. 9 illustrates an example in which one liquid crystal element 340 and one light-emitting element 360 are provided in one pixel 410, one embodiment of the present invention is not limited thereto. FIG. 10A illustrates an example in which one liquid crystal element 340 and four light-emitting elements 360 (light-emitting elements 360r, 360g, 360b, and 360w) are provided in one pixel 410.

The structure shown in FIG. 10A, which is similar to FIG. 9, further includes a wiring G3 and a wiring S3 that are connected to the pixel 410.

In the example in FIG. 10A, light-emitting elements emitting red light (R), green light (G), blue light (B), and white light (W) can be used as the four light-emitting elements 360, for example. As the liquid crystal element 340, a reflective liquid crystal element casting white light can be used. Thus, in the case of performing display in the reflective mode, white display with high reflectance can be performed. In the case of performing display in the transmissive mode, an image can be displayed with a high color rendering property at low power consumption.

Figure 10B:
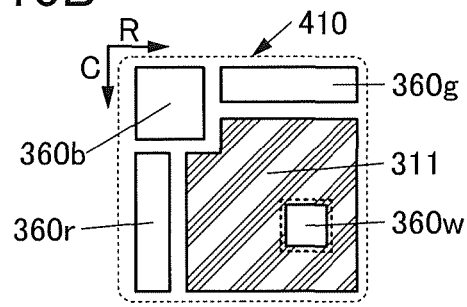
FIG. 10B is a top view of a pixel.

FIG. 10B illustrates a structure example of the pixel 410. The pixel 410 includes the light-emitting element 360w that overlaps with an opening of an electrode 311, and the light-emitting elements 360r, 360g, and 360b that are arranged in the periphery of the electrode 311. The light-emitting areas of the light-emitting elements 360r, 360g, and 360b are preferably almost equal to one another.

Structure Example of Display Panel

Figure 11:
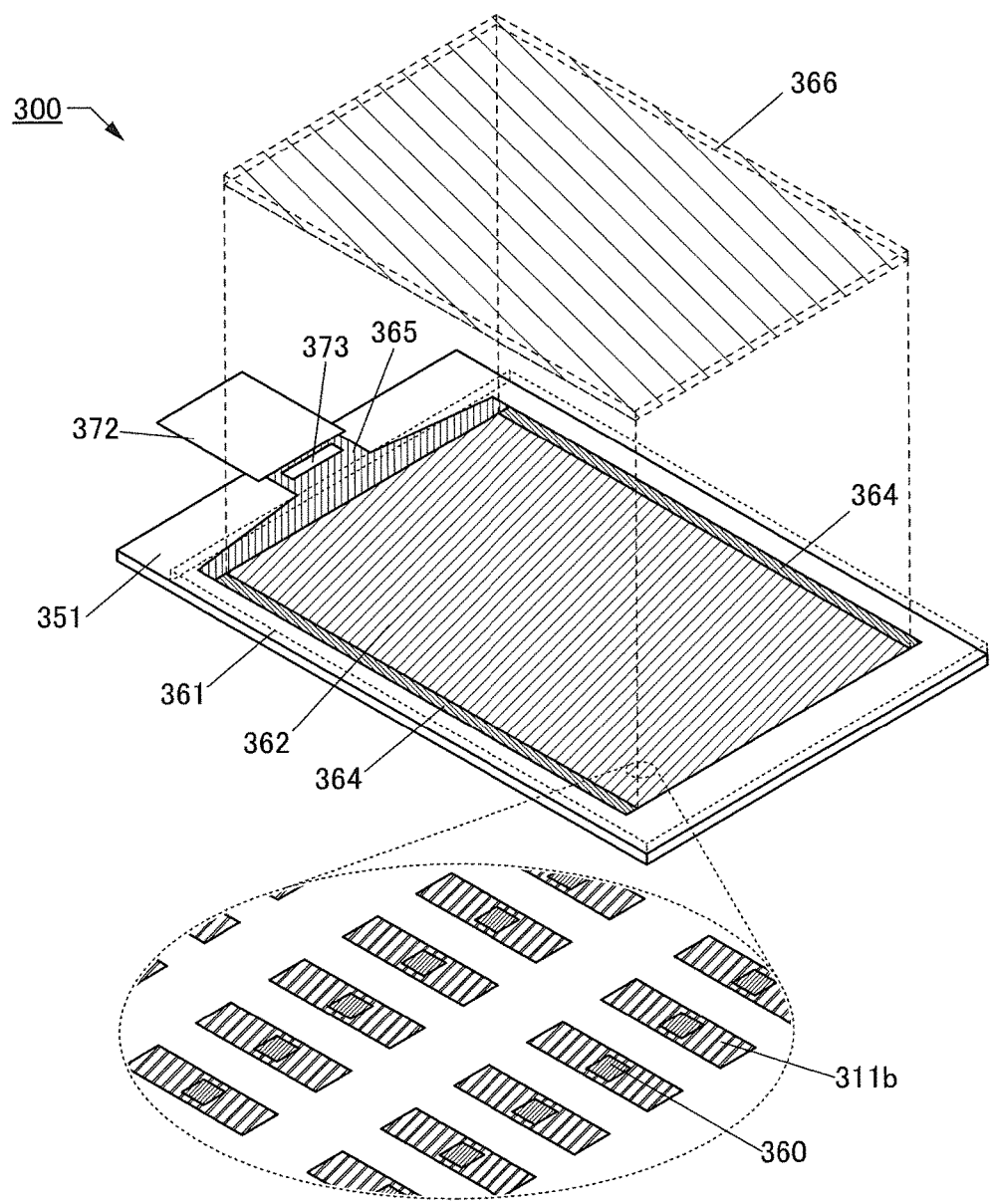
FIG. 11 illustrates a structure of a display device.

FIG. 11 is a schematic perspective view of a display panel 300 of one embodiment of the present invention. In the display panel 300, a substrate 351 and a substrate 361 are attached to each other. In FIG. 11, the substrate 361 is denoted by a dashed line.

The display panel 300 includes the display portion 362, a circuit 364, a wiring 365, and the like. The substrate 351 is provided with the circuit 364, the wiring 365, the conductive layer 311b that serves as a pixel electrode, and the like. In FIG. 11, an IC 373 and an FPC 372 are mounted on the substrate 351. Thus, the structure illustrated in FIG. 11 can be referred to as a display module including the display panel 300, the FPC 372, and the IC 373.

As the circuit 364, for example, a circuit functioning as a scan line driver circuit can be used.

The wiring 365 has a function of supplying signals and electric power to the display portion and the circuit 364. The signal or electric power is input to the wiring 365 from the outside through the FPC 372 or from the IC 373.

FIG. 11 shows an example in which the IC 373 is provided on the substrate 351 by a chip on glass (COG) method or the like. As the IC 373, an IC functioning as a scan line driver circuit, a signal line driver circuit, or the like can be used. Note that the IC 373 is not necessarily provided when, for example, the display panel 300 includes circuits serving as a scan line driver circuit and a signal line driver circuit or when the circuits serving as a scan line driver circuit and a signal line driver circuit are provided outside and a signal for driving the display panel 300 is input through the FPC 372. Alternatively, the IC 373 may be mounted on the FPC 372 by a chip on film (COF) method or the like.

FIG. 11 also shows an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 11, the conductive layer 311b has an opening. The light-emitting element 360 is positioned closer to the substrate 351 than the conductive layer 311b is. Light is emitted from the light-emitting element 360 to the substrate 361 side through the opening in the conductive layer 311b.

A touch sensor may be provided for the substrate 361. For example, a sheet-like capacitive touch sensor 366 may be provided to overlap with the display portion 362. Alternatively, a touch sensor may be provided between the substrate 361 and the substrate 351. When a touch sensor is between the substrates 361 and 351, an optical touch sensor using a photoelectric conversion element can be used as well as a capacitive touch sensor.

Figure 12:
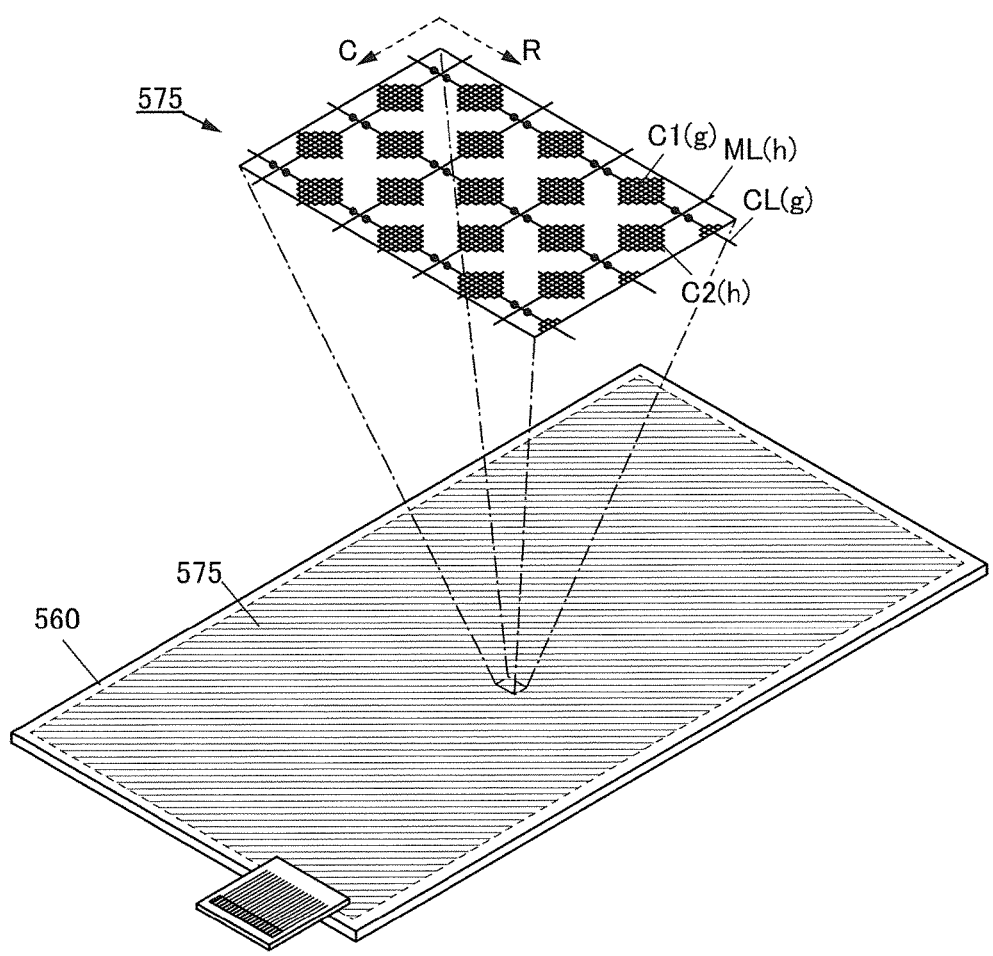
FIG. 12 illustrates a structure of a touch sensor.
Figure 13A:
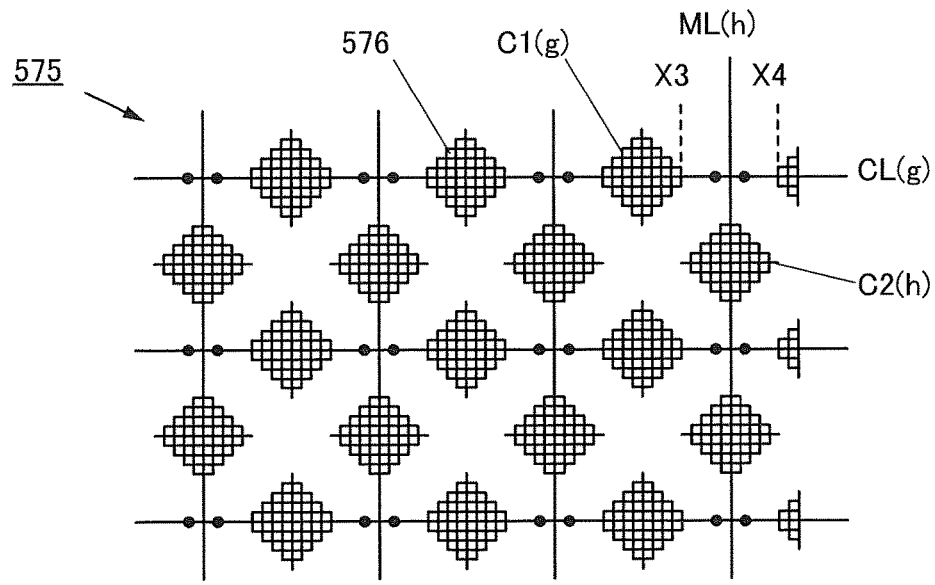
FIGS. 13A and 13B illustrate a structure of a touch sensor.
Figure 13B:
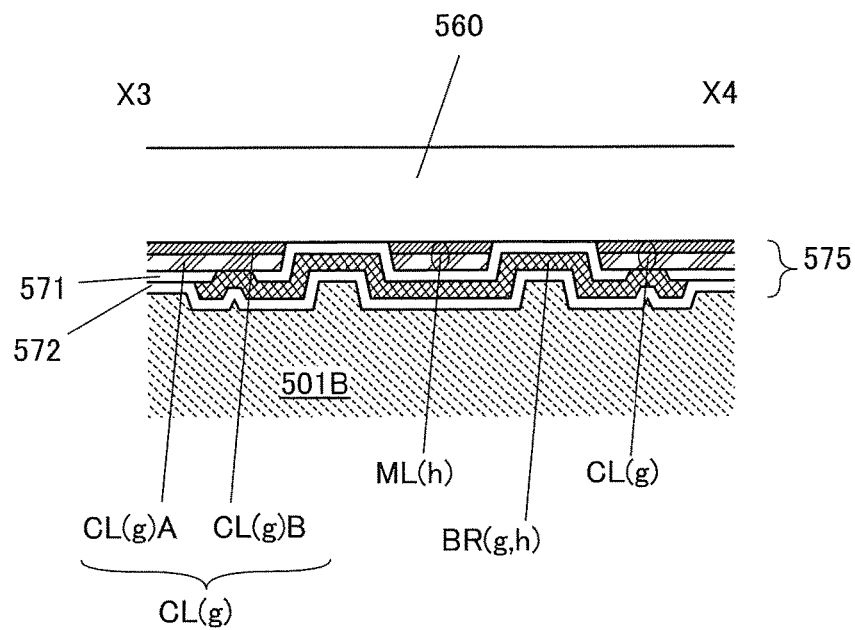

FIG. 12 shows an example of a capacitive touch sensor provided for a substrate. Part of the touch sensor is enlarged in the drawing. FIG. 13A is a top view of the touch sensor; the touch sensor includes a proximity sensor. FIG. 13B is a cross-sectional view along line X3-X4 in FIG. 13A. A substrate 560 for which the touch sensor is provided corresponds to the second substrate 12 shown in FIGS. 1A and 1B and the like.

An insulating film 501B in FIG. 13B corresponds to the adhesive layer 26 shown in FIGS. 1A and 1B and the like. An insulating film 572 includes a region sandwiched between the insulating film 501B and a proximity sensor 575.

A sensing element for sensing a change in capacitance, illuminance, magnetic force, a radio wave, pressure, or the like caused by an approach of an object and supplying a signal based on the sensed physical quantity can be used for the proximity sensor 575.

For example, a conductive film, a photoelectric conversion element, a magnetic sensing element, a piezoelectric element, or a resonator can be used as the sensing element.

For example, a sensing circuit having a function of supplying a signal that varies according to the parasitic capacitance of a conductive film can be used for the proximity sensor 575. A control signal is supplied to a first electrode, and the potential, current, or the like of a second electrode that changes according to the supplied control signal and the capacitance is obtained and can be supplied as a sensing signal. Thus, a finger or the like that approaches the conductive film in the air can be sensed with change in capacitance.

For example, the proximity sensor 575 can include a first electrode C1($g$) and a second electrode C2($h$) (see FIG. 12 and FIG. 13A). The second electrode C2($h$) has a portion not overlapping with the first electrode C1($g$). Note that each of g and h is a natural number of 1 or more.

Specifically, in the proximity sensor 575, the first electrode C1($g$) is electrically connected to a control line CL($g$) extended in a row direction (a direction indicated by the arrow R in FIG. 12) and the second electrode C2($h$) is electrically connected to a signal line ML(h) extended in a column direction intersecting with the row direction (a direction indicated by the arrow C in FIG. 12).

For the first electrode C1($g$) or the second electrode C2($h$), a conductive film whose light-transmitting regions overlap with the pixel 410 can be used, for example.

For the first electrode C1($g$) or the second electrode C2($h$), a net-like conductive film whose openings 576 overlap with the pixel 410 can be used, for example.

The control line CL($g$) is provided with the wiring BR(g, h). The control line CL(g) intersects with the signal line ML(h) in a portion where the wiring BR(g, h) exists (see FIG. 13B).

A stacked-layer film can be used for the first electrode C1($g$), the second electrode C2($h$), the control line CL(g), or the signal line ML(h), for example. Specifically, a stacked-layer film in which a conductive film CL(g)A and a dark-colored film CL(g)B are stacked so that the conductive film CL(g)A is sandwiched between the dark-colored film CL(g)B and the pixel 410 can be used.

A film having a lower visible light reflectance than the conductive film CL(g)A can be used as the dark-colored film CL(g)B, for example. Thus, reflection of visible light due to the first electrode C1($g$), the second electrode C2($h$), the control line CL(g), or the signal line ML(h) can be reduced. Consequently, display of the display portion 362 can be clearer, so that favorable display can be obtained. In addition, the thickness of the display device can be reduced. Moreover, stress caused in the substrate 560 or the like when the display device is bent can be reduced.

For example, a material available for the wirings G1, G2, ANO, CSCOM, and the like can be used for the conductive film CL(g)A.

A film containing cupric oxide or a film containing copper chloride or tellurium chloride can be used as the dark-colored film CL(g)B, for example. Alternatively, the dark-colored film CL(g)B may be formed with a metal particle such as an Ag particle, an Ag fiber, or a Cu particle, a carbon nanoparticle such as a carbon nanotube (CNT) or graphene, or a conductive high molecule such as PEDOT, polyaniline, or polypyrrole, for example.

The proximity sensor 575 includes an insulating film 571 between the wiring BR(g, h) and the signal line ML(h). Thus, a short circuit between the wiring BR(g, h) and the signal line ML(h) can be prevented.

Example of Cross-Sectional Structure

Figure 14:
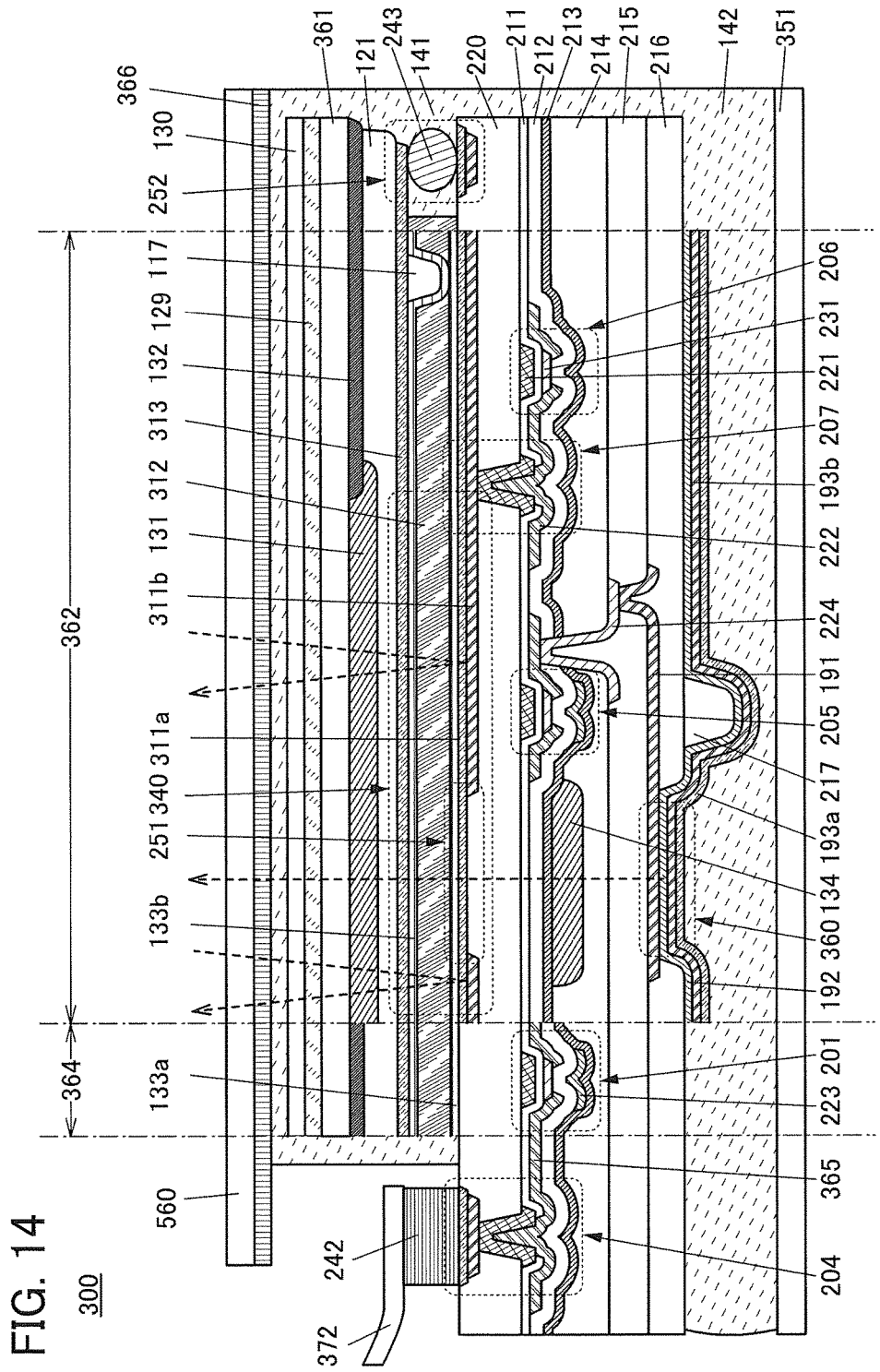
FIG. 14 illustrates a structure of a display device.

FIG. 14 shows an example of cross sections of part of a region including the FPC 372, part of a region including the circuit 364, part of a region including the display portion 362, and the touch sensor 366 of the display panel illustrated in FIG. 11.

The display panel includes an insulating layer 220 between the substrates 351 and 361. The display panel also includes the light-emitting element 360, a transistor 201, a transistor 205, a transistor 206, a coloring layer 134, and the like between the substrate 351 and the insulating layer 220. Furthermore, the display panel includes the liquid crystal element 340, a coloring layer 131, and the like between the insulating layer 220 and the substrate 361. The substrate 361 and the insulating layer 220 are bonded with an adhesive layer 141. The substrate 351 and the insulating layer 220 are bonded with an adhesive layer 142.

The transistor 206 is electrically connected to the liquid crystal element 340. The transistor 205 is electrically connected to the light-emitting element 360. Since the transistors 205 and 206 are formed on a surface of the insulating layer 220 that is on the substrate 351 side, the transistors 205 and 206 can be formed through the same process.

The substrate 361 is provided with the coloring layer 131, a light-blocking layer 132, an insulating layer 121, a conductive layer 313 serving as a common electrode of the liquid crystal element 340, an alignment film 133b, an insulating layer 117, and the like. The insulating layer 117 serves as a spacer for holding a cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Parts of the insulating layer 211 function as gate insulating layers of the transistors. The insulating layers 212, 213, and 214 cover the transistors. The insulating layer 215 covers the insulating layer 214. The insulating layers 214 and 215 each function as a planarization layer. Note that the three insulating layers, the insulating layers 212, 213, and 214, are provided to cover the transistors and the like in this example; however, one embodiment of the present invention is not limited to this example, and four or more insulating layers, a single insulating layer, or two insulating layers may be provided.

The insulating layer 214 functioning as a planarization layer is not necessarily provided when not needed.

The transistors 201, 205, and 206 each include a conductive layer 221 part of which functions as a gate, conductive layers 222 parts of which function as a source and a drain, and a semiconductor layer 231. Here, a plurality of layers obtained by processing the same conductive film are shown with the same hatching pattern.

The liquid crystal element 340 is a reflective liquid crystal element. The liquid crystal element 340 has a structure in which a conductive layer 311a, a liquid crystal 312, and the conductive layer 313 are stacked. The conductive layer 311b that reflects visible light is in contact with the substrate 351 side of the conductive layer 311a. The conductive layer 311b includes an opening 251. The conductive layers 311a and 313 each contain a material transmitting visible light. In addition, an alignment film 133a is between the liquid crystal 312 and the conductive layer 311a and the alignment film 133b is between the liquid crystal 312 and the conductive layer 313.

A light diffusion plate 129 and a polarizing plate 130 are provided for an outer surface of the substrate 361. As the polarizing plate 130, a linear polarizing plate or a circularly polarizing plate can be used. An example of a circularly polarizing plate is a stack including a linear polarizing plate and a quarter-wave retardation plate. Such a structure can reduce reflection of external light. The light diffusion plate can reduce reflection of external light. The cell gap, alignment, drive voltage, and the like of the liquid crystal element used as the liquid crystal element 340 are controlled depending on the kind of the polarizing plate so that desirable contrast is obtained.

In the liquid crystal element 340, the conductive layer 311b has a function of reflecting visible light, and the conductive layer 313 has a function of transmitting visible light. Light entering from the substrate 361 side is polarized by the polarizing plate 130, passes through the conductive layer 313 and the liquid crystal 312, and is reflected by the conductive layer 311b. Then, the light passes through the liquid crystal 312 and the conductive layer 313 again and reaches the polarizing plate 130. Here, the alignment of the liquid crystal is controlled by voltage applied between the conductive layer 311b and the conductive layer 313, whereby optical modulation of light can be controlled. That is, the intensity of light casted through the polarizing plate 130 can be controlled. Light other than one in a particular wavelength region is absorbed by the coloring layer 131, and thus, extracted light exhibits, for example, red light.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a covers the conductive layer 193b. The conductive layer 193b contains a material reflecting visible light, and the conductive layers 191 and 193a each contain a material transmitting visible light. Light is emitted from the light-emitting element 360 to the substrate 361 side through the coloring layer 134, the insulating layer 220, the opening 251, the conductive layer 313, and the like.

Here, as illustrated in FIG. 14, the conductive layer 311a transmitting visible light is preferably provided for the opening 251. Accordingly, the liquid crystal 312 is aligned in a region overlapping with the opening 251 as in the other regions, which prevents an alignment defect of the liquid crystal in the boundary portion of these regions and reduces undesired light leakage.

An insulating layer 217 is provided on the insulating layer 216 covering an end portion of the conductive layer 191. The insulating layer 217 has a function as a spacer for preventing the insulating layer 220 and the substrate 351 from getting closer than necessary. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is formed. Note that the insulating layer 217 is not necessarily provided when not needed.

One of a source and a drain of the transistor 205 is electrically connected to the conductive layer 191 of the light-emitting element 360 through a conductive layer 224.

One of a source and a drain of the transistor 206 is electrically connected to the conductive layer 311b through a connection portion 207. The conductive layers 311b and 311a are in contact with and electrically connected to each other. Here, in the connection portion 207, the conductive layers on both surfaces of the insulating layer 220 are connected to each other in an opening in the insulating layer 220.

A connection portion 204 is provided in a region in which the substrate 351 and the substrate 361 do not overlap with each other. The connection portion 204 is electrically connected to the FPC 372 through a connection layer 242. The connection portion 204 has a structure similar to that of the connection portion 207. On the surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region where the adhesive layer 141 is provided. In the connection portion 252, the conductive layer obtained by processing the same conductive film as the conductive layer 311a is electrically connected to part of the conductive layer 313 with a connector 243. Accordingly, a signal or a potential input from the FPC 372 connected to the substrate 351 side can be supplied to the conductive layer 313 formed on the substrate 361 side through the connection portion 252.

As the connector 243, a conductive particle can be used, for example. As the conductive particle, a particle of an organic resin, silica, or the like coated with a metal material can be used. It is preferable to use nickel or gold, which can reduce contact resistance, as the metal material. It is also preferable to use a particle coated with layers of two or more kinds of metal materials, such as a particle coated with nickel and further with gold. As the connector 243, a material capable of elastic deformation or plastic deformation is preferably used. As illustrated in FIG. 14, the connector 243 that is the conductive particle has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably covered with the adhesive layer 141. For example, the connectors 243 are dispersed in the adhesive layer 141 that is not yet cured.

The touch sensor 366 provided for the substrate 560 is attached to the polarizing plate 130 with the adhesive layer 141 therebetween.

FIG. 14 illustrates an example where the circuit 364 includes the transistor 201.

In the example of FIG. 14, the transistors 201 and 205 each have a structure in which the semiconductor layer 231 where a channel is formed is between two gates. One gate is formed by the conductive layer 221 and the other gate is formed by a conductive layer 223 overlapping with the semiconductor layer 231 with the insulating layer 212 therebetween. Such a structure enables control of threshold voltages of the transistor. In that case, the two gates may be connected to each other and supplied with the same signal to operate the transistor. Such a transistor can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel with the increased number of wirings due to increase in size or definition.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for at least one of the insulating layers 212 and 213 that cover the transistors. Thus, the insulating layer 212 or the insulating layer 213 can function as a barrier film. Such a structure can effectively suppress diffusion of the impurities into the transistors from the outside, and a highly reliable display panel can be provided.

The insulating layer 121 is provided on the substrate 361 side to cover the coloring layer 131 and the light-blocking layer 132. The insulating layer 121 may have a function as a planarization layer. The insulating layer 121 enables the conductive layer 313 to have an almost flat surface, resulting in a uniform alignment state of the liquid crystal 312.

[Components]

The above components will be described below.

[Substrate]

A material having a flat surface can be used as the substrate included in the display panel. The substrate through which light from the display element is extracted is formed using a material that transmits the light. For example, a material such as glass, quartz, ceramic, sapphire, or an organic resin can be used.

The weight and thickness of the display panel can be decreased by using a thin substrate. A flexible display panel can be obtained by using a substrate that is thin enough to have flexibility.

Since the substrate through which light is not extracted does not need to have a light-transmitting property, a metal substrate or the like can be used as well as the above-mentioned substrates. A metal material, which has high thermal conductivity, is preferable because it can easily conduct heat to the whole substrate and accordingly can prevent a local temperature rise in the display panel. To obtain flexibility or bendability, the thickness of a metal substrate is preferably greater than or equal to 10 and less than or equal to 200 μm, more preferably greater than or equal to 20 μm and less than or equal to 50 μm.

Although there is no particular limitation on a material of a metal substrate, it is favorable to use, for example, a metal such as aluminum, copper, or nickel, or an alloy such as an aluminum alloy or stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of a material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). In particular, a material with a low thermal expansion coefficient is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is light in weight, and thus a display panel using this substrate can also be light in weight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, or the like can be given. These fibers may be used in a state of a woven or nonwoven fabric, and a structure body formed by impregnating the fibrous body with a resin and curing the resin may be used as the flexible substrate. The structure body including the fibrous body and the resin is preferably used as the flexible substrate, in which case the reliability against breaking due to bending or local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer or an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with a low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is included, a barrier property against water and oxygen can be improved and thus a highly reliable display panel can be provided.

[Transistor]

The transistors each include the conductive layer functioning as a gate electrode, the semiconductor layer, the conductive layer functioning as a source electrode, the conductive layer functioning as a drain electrode, and the insulating layer functioning as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

A transistor with an oxide semiconductor having a larger band gap and a lower carrier density than silicon has a low off-state current and therefore charges accumulated in a capacitor that is series-connected to the transistor can be held for a long time.

The semiconductor layer can be, for example, a film represented by an In-M-Zn-based oxide, which contains at least indium, zinc, and M (a metal such as aluminum, titanium, gallium, germanium, yttrium, zirconium, lanthanum, cerium, tin, neodymium, or hafnium).

In the case where the oxide semiconductor in the semiconductor layer contains an In-M-Zn-based oxide, it is preferable that the atomic ratio of metal elements of a sputtering target used for forming a film of the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable to reduce the number of manufacturing steps. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

An oxide semiconductor film with a low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and thus can be referred to as an oxide semiconductor having stable characteristics.

However, the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor included in the semiconductor layer, the semiconductor layer includes an increased number of oxygen vacancies, and thus becomes n-type. Thus, the concentration of silicon or carbon (measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal can generate carriers when bonded to the oxide semiconductor, which could increase the off-state current of the transistor. Therefore, the concentration of alkali metal or alkaline earth metal in the semiconductor layer, which is measured by secondary ion mass spectrometry, is set to lower than or equal to $1\times10^{18}$ atoms/cm$^3$, preferably lower than or equal to $2\times10^{16}$ atoms/cm$^3$.

When nitrogen is contained in the oxide semiconductor included in the semiconductor layer, electrons serving as carriers are generated and the carrier density increases, so that the semiconductor layer easily becomes n-type. Thus, a transistor including the oxide semiconductor that contains nitrogen is likely to be normally-on. Hence, the concentration of nitrogen in the semiconductor layer, which is measured by secondary ion mass spectrometry, is preferably set to lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, and an amorphous structure, for example. Among the non-single-crystal structures, the amorphous structure has the highest density of defect states, whereas CAAC-OS has the lowest density of defect states.

An oxide semiconductor film having an amorphous structure has, for example, disordered atomic arrangement and no crystalline component. An oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above regions.

<Composition of CAC-OS>

A metal oxide having a CAC composition that can be used for the semiconductor layer of the transistor disclosed in one embodiment of the present invention will be described in detail below. Here, description is made using a CAC-OS as a typical example of the metal oxide having a CAC composition.

Figure 15:
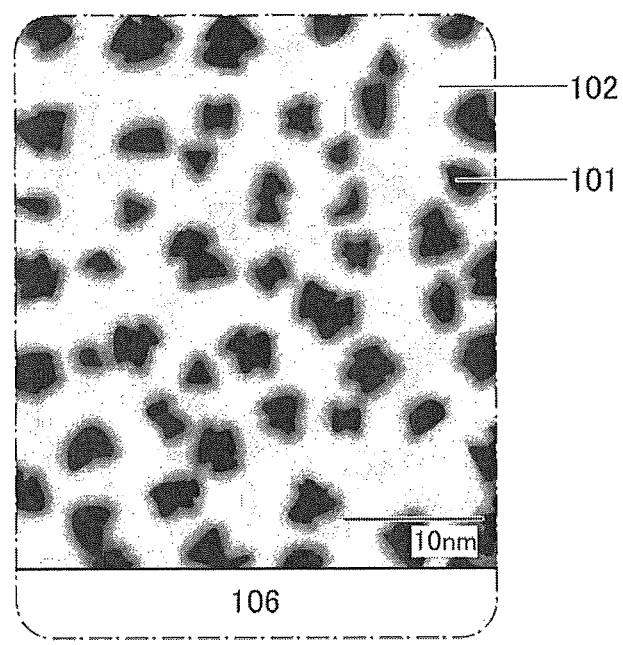
FIG. 15 is a conceptual diagram of a composition of a metal oxide.

For example, in the CAC-OS, elements included in the metal oxide are unevenly distributed, and regions 101 mainly including an element and regions 102 mainly including another element are formed, as shown in the example of FIG. 15 in which CAC-OS is formed over an insulating film 106. The regions 101 and 102 are mixed or distributed to form a mosaic pattern. In other words, the CAC-OS has a composition in which elements included in a metal oxide are unevenly distributed. Materials including unevenly distributed elements each have a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{x3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{x3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 16:
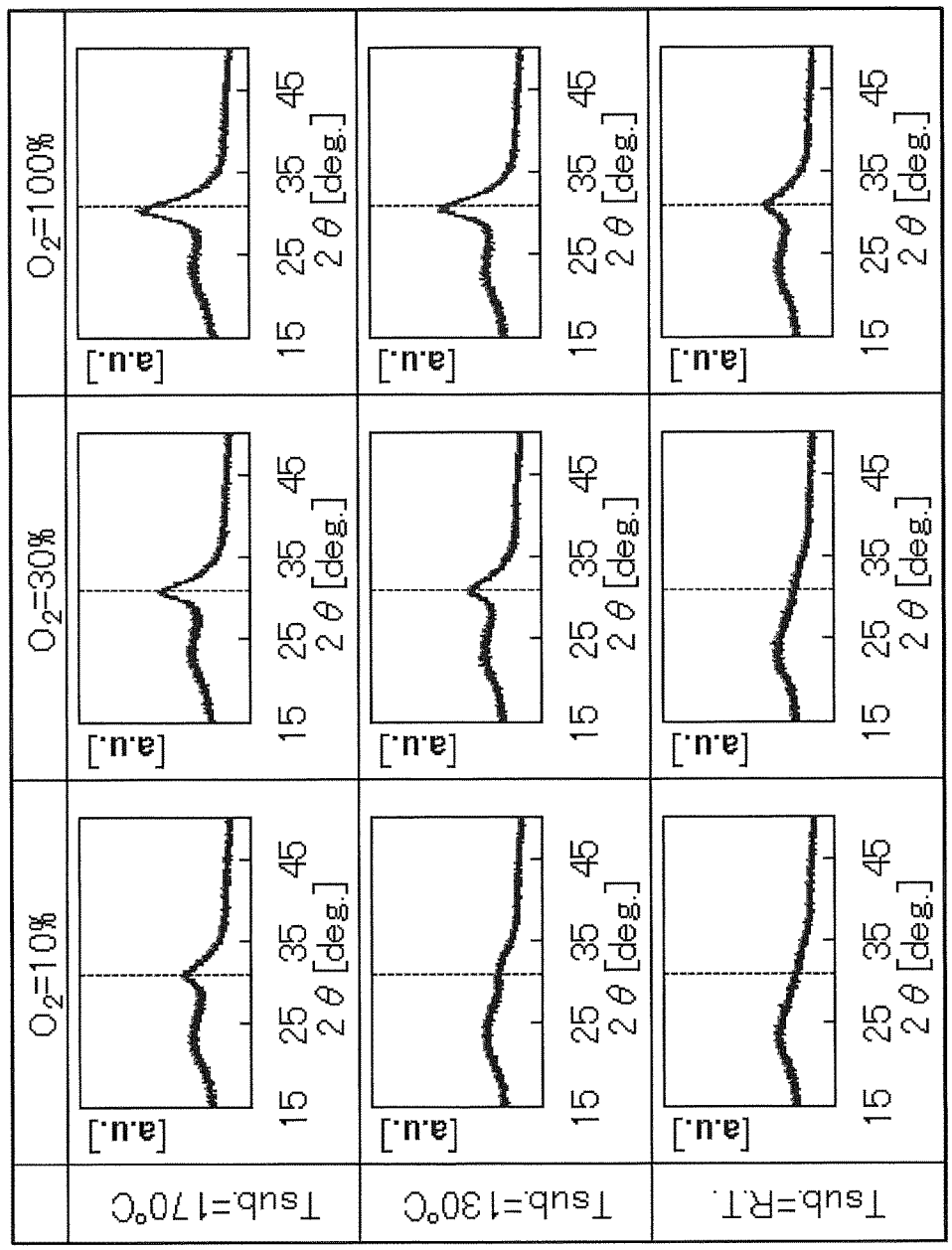
FIG. 16 shows measured XRD spectra of samples.

FIG. 16 shows XRD spectra measured by an out-of-plane method. In FIG. 16, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 16, the higher the substrate temperature at the time of formation is or the higher the oxygen gas flow rate ratio at the time of formation is, the higher the intensity of the peak at around $2q=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 16, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 17A is a plan-view TEM image of the sample fat Hied at a substrate temperature of R.T. and an oxygen gas flow ratio of 10%. FIG. 17B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 17A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 17C, 17D, 17E, 17F, and 17G show the results of the points indicated by the black dots a1, a2, a3, a4, and a5, respectively.

In FIGS. 17C, 17D, 17E, 17F, and 17G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 17B of the sample Ruined at a substrate temperature of R.T. and an oxygen gas flow rate ratio of 10% are observed. FIGS. 17H, 17I, 17J, 17K, and 17L show the results of the points indicated by the black dots b1, b2, b3, b4, and b5, respectively.

In FIGS. 17H, 17I, 17J, 17K, and 17L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 18A:
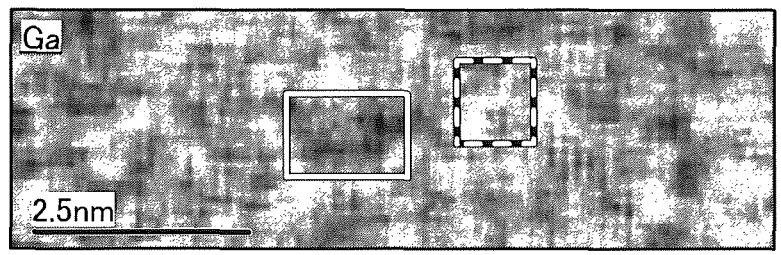
FIGS. 18A to 18C show EDX mapping images of a sample.
Figure 18B:
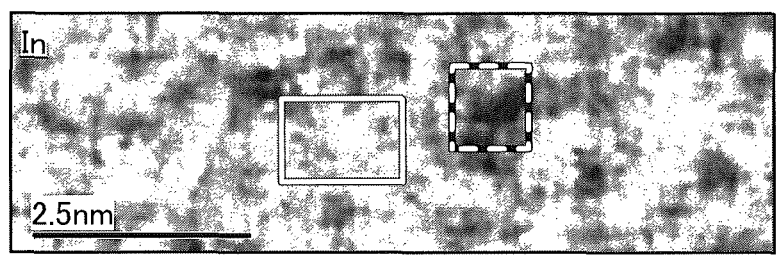
Figure 18C:
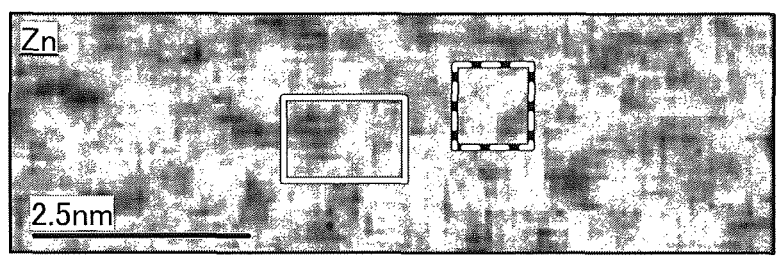

FIGS. 18A to 18C show EDX mapping images in a cross section of the sample formed at a substrate temperature of R.T. and with an oxygen gas flow rate ratio of 10%. FIG. 18A shows an EDX mapping image of Ga atoms. The proportion of the Ga atoms in all the atoms is 1.18 atomic % to 18.64 atomic %. FIG. 18B shows an EDX mapping image of In atoms. The proportion of the In atoms in all the atoms is 9.28 atomic % to 33.74 atomic %. FIG. 18C shows an EDX mapping image of Zn atoms. The proportion of the Zn atoms in all the atoms is 6.69 atomic % to 24.99 atomic %. FIGS. 18A to 18C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 18A to 18C is 7200000 times.

The EDX mapping images in FIGS. 18A to 18C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 18A to 18C are examined.

In FIG. 18A, a relatively dark region occupies a large area in the area surrounded by the solid line, while a relatively bright region occupies a large area in the area surrounded by the dashed line. In FIG. 18B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 18C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 18C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 18A to 18C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 18A to 18C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

Alternatively, silicon may be used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, a top-gate transistor is preferable to form an impurity region with ease in a self-aligned manner and reduce variation in characteristics. The top-gate transistor is particularly preferable when polycrystalline silicon, single-crystal silicon, or the like is employed.

[Conductive Layer]

Examples of materials for a gate, a source, and a drain of a transistor and a conductive layer such as a wiring or an electrode included in a display device include metals such as aluminum, titanium, chromium, nickel, copper, yttrium, zirconium, molybdenum, silver, tantalum, and tungsten, and an alloy containing any of these metals as its main component. A single-layer structure or multi-layer structure including a film containing any of these materials can be used. For example, the following structures can be employed: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases shape controllability in etching.

Examples of a light-transmitting conductive material include a conductive oxide such as indium oxide, indium tin oxide, indium zinc oxide, zinc oxide, or zinc oxide to which gallium is added, and graphene. It is also possible to use, for example, a metal material such as gold, silver, platinum, magnesium, nickel, tungsten, chromium, molybdenum, iron, cobalt, copper, palladium, or titanium; an alloy material containing any of these metal materials; or a nitride of any of these metal materials (e.g., titanium nitride). In the case of using the metal material or the alloy material (or the nitride thereof), the film thickness is set small enough to transmit light. Alternatively, a layered film of any of the above materials can be used for the conductive layers. For example, a layered film of indium tin oxide and an alloy of silver and magnesium is preferably used because it can increase the conductivity. These materials can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as an acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m²·day)], preferably lower than or equal to $1\times10^{-6}$ [g/(m²·day)], further preferably lower than or equal to $1\times10^{-7}$ [g/(m²·day)], still further preferably lower than or equal to $1\times10^{-8}$ [g/(m²·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ any of a variety of modes. For example, the liquid crystal element can employ a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like, instead of employing a vertical alignment (VA) mode.

The liquid crystal element controls transmission or non-transmission of light with the use of an optical modulation action of a liquid crystal. The optical modulation action of a liquid crystal is controlled by an electric field applied to the liquid crystal (including a horizontal electric field, a vertical electric field, and an oblique electric field). Examples of the liquid crystal used for the liquid crystal element include thermotropic liquid crystal, low-molecular liquid crystal, high-molecular liquid crystal, polymer dispersed liquid crystal (PDLC), ferroelectric liquid crystal, and anti-ferroelectric liquid crystal. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material is selected depending on the mode or design to be employed.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases. When the temperature of cholesteric liquid crystal is being increased, the blue phase is generated just before a cholesteric phase changes into an isotropic phase. Since the blue phase appears only in a narrow temperature range, a liquid crystal composition in which a chiral material is mixed to account for several weight percent or more is used for the liquid crystal layer in order to improve the temperature range. The liquid crystal composition that includes a liquid crystal exhibiting a blue phase and a chiral material has a short response time and optical isotropy; in addition, such a liquid crystal composition does not require the alignment process and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

The liquid crystal element may be a transmissive liquid crystal element, a reflective liquid crystal element, a semi-transmissive liquid crystal element, or the like.

In one embodiment of the present invention, the reflective liquid crystal element can be particularly used.

In the case where a transmissive or semi-transmissive liquid crystal element is used, two polarizing plates are provided such that a pair of substrates are sandwiched therebetween. Furthermore, a backlight is provided on the outer side of the polarizing plate. As the backlight, a direct-below backlight or an edge-light backlight may be used. It is preferable to use a direct-below backlight including an LED, with which local dimming can be easily performed and contrast can be increased. The edge-light backlight is preferably used to reduce the thickness of a module including the backlight.

In the case where a reflective liquid crystal element is used, a polarizing plate is provided on the display surface side. In addition, a light diffusion plate is preferably provided on the display surface side to improve visibility.

In the case where the reflective or the semi-transmissive liquid crystal element is used, a front light may be provided outside the polarizing plate. As the front light, an edge-light front light is preferably used. A front light including an LED is preferably used to reduce power consumption.

[Light-Emitting Element] As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, a plurality of light-emitting layers in the EL layer may be stacked in contact with each other or may be stacked with a region not including any light-emitting material therebetween. For example, between a fluorescent layer and a phosphorescent layer, a region containing no light-emitting element but the same material as one in the fluorescent layer or phosphorescent layer (for example, a host material or an assist material) may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) that is thin enough to have a light-transmitting property can be used. Alternatively, a layered film of any of the above materials can be used for the conductive layer. For example, a layered film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of indium tin oxide and silver, a stack of indium tin oxide and an alloy of silver and magnesium, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, a quantum dot included in the light-emitting layer can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Still alternatively, an adhesive sheet or the like may be used.

Furthermore, the above-mentioned resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element and improves the reliability of the display panel.

In addition, when the resin is mixed with a filler with a high refractive index or a light-scattering member, light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A layered film containing the material of the coloring layer can also be used for the light-blocking layer. For example, a stacked-layer structure of a film containing a material of a coloring layer that transmits light of a certain color and a film containing a material of a coloring layer that transmits light of another color can be employed. The coloring layer and the light-blocking layer are preferably formed using the same material, in which case the same manufacturing apparatus can be used and the process can be simplified.

At least part of this embodiment can be implemented in combination with any of the other embodiments and the other examples described in this specification as appropriate.

Embodiment 4

In this embodiment, an example of a transistor that can be used as the transistors described in the above embodiments will be described with reference to drawings.

The display device of one embodiment of the present invention can be fabricated by using a transistor with any of various modes, such as a bottom-gate transistor or a top-gate transistor. Therefore, a material for a semiconductor layer or the structure of a transistor can be easily changed depending on the existing production line.

<5-1. Bottom-Gate Transistor>

FIG. 19A1 is a cross-sectional view in the channel length direction of a transistor 810 that is a channel-protective transistor, which is a type of bottom-gate transistor. FIGS. 19A2, 19B1, 19B2, 19C1, and 19C2 are each a cross-sectional view of a bottom-gate transistor in the channel length direction.

In FIG. 19A1, the transistor 810 is over a substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 includes an electrode 744a and an electrode 744b that are in contact with part of the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. With one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electric characteristics of the transistor, such as the field-effect mobility and the threshold voltage, can be favorable.

In the case where a semiconductor such as silicon is used for the semiconductor layer 742, a layer that functions as an n-type semiconductor or a p-type semiconductor is preferably present between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. The formation of the insulating layer 729 may be omitted where appropriate.

A transistor 811 illustrated in FIG. 19A2 is different from the transistor 810 in that an electrode 723 that can serve as a back gate electrode is provided over the insulating layer 729. The electrode 723 can be formed using a material and a method similar to those of the electrode 746.

In general, the back gate electrode is formed using a conductive layer and positioned so that the channel formation region of the semiconductor layer is between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

FIG. 20A1 illustrates a cross-sectional view in the channel width direction of the transistor 810. FIG. 20A2 illustrates a cross-sectional view in the channel width direction of the transistor 811. FIG. 20B1 illustrates a cross-sectional view in the channel width direction of a transistor 820. FIG. 20B2 illustrates a cross-sectional view in the channel width direction of a transistor 821. FIG. 20C1 illustrates a cross-sectional view in the channel width direction of a transistor 825. FIG. 20C2 illustrates a cross-sectional view in the channel width direction of a transistor 826.

In each of the structures illustrated in FIG. 20B2 and FIG. 20C2, the gate electrode is connected to the back gate electrode, and the gate electrode and the back gate electrode have the same potential.

Furthermore, in each of the structures illustrated in FIG. 20B2 and FIG. 20C2, the semiconductor layer 742 is positioned between the gate electrode and the back gate electrode. The length in the channel width direction of each of the gate electrode and the back gate electrode is greater than the length in the channel width direction of the semiconductor layer 742. In the channel width direction, the whole of the semiconductor layer 742 is covered with the gate electrode or the back gate electrode with the insulating layers 726, 741, 728, and 729 positioned therebetween. With the structure, the semiconductor layer 742 included in the transistor can be surrounded by the electric field of the gate electrode and the back gate electrode.

A device structure of a transistor, like that of the transistor 821 or the transistor 826, in which the electric field of a gate electrode and a back gate electrode electrically surrounds the semiconductor layer 742 in which a channel region is formed can be referred to as a surrounded channel (S-channel) structure.

With the S-channel structure, an electric field for inducing a channel can be effectively applied to the semiconductor layer 742 by one or both of the gate electrode and the back gate electrode, which enables improvement in the current drive capability of the transistor and offers high on-state current characteristics. Since the on-state current can be increased, the transistor can be minimized. Furthermore, with the S-channel structure, the mechanical strength of the transistor can be increased.

The electrode 746 and the electrode 723 can each serve as a gate electrode. Thus, the insulating layers 726, 728, and 729 can each serve as a gate insulating layer. The electrode 723 may be between the insulating layers 728 and 729.

In the case where one of the electrode 746 and the electrode 723 is simply referred to as a "gate electrode", the other can be referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrode 746 and the electrode 723 may be referred to as a "first gate electrode", and the other may be referred to as a "second gate electrode".

By providing the electrode 746 and the electrode 723 with the semiconductor layer 742 therebetween and setting the potentials of the electrode 746 and the electrode 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. With one embodiment of the present invention, the area occupied by a transistor can be reduced. Therefore, with one embodiment of the present invention, a highly integrated semiconductor device can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

FIG. 19B1 is a cross-sectional view of the transistor 820 that is a channel-protective transistor, which is a type of bottom-gate transistor. The transistor 820 has substantially the same structure as the transistor 810 but is different from the transistor 810 in that the insulating layer 741 covers an end portion of the semiconductor layer 742. The semiconductor layer 742 is electrically connected to the electrode 744a in an opening formed by selectively removing part of the insulating layer 741 that overlaps with the semiconductor layer 742. The semiconductor layer 742 is electrically connected to the electrode 744b in another opening formed by selectively removing part of the insulating layer 741 that overlaps with the semiconductor layer 742. A region of the insulating layer 741 that overlaps with the channel formation region can function as a channel protective layer.

The transistor 821 illustrated in FIG. 19B2 is different from the transistor 820 in that the electrode 723 that can serve as a back gate electrode is positioned over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The distance between the electrode 744a and the electrode 746 and the distance between the electrode 744b and the electrode 746 in the transistors 820 and 821 are larger than those in the transistors 810 and 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with excellent electrical characteristics can be provided.

The transistor 825 illustrated in FIG. 19C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

The transistor 826 illustrated in FIG. 19C2 is different from the transistor 825 in that the electrode 723 that can serve as a back gate electrode is positioned over the insulating layer 729.

<5-2. Top-Gate Transistor>

FIG. 21A1 is a cross-sectional view in the channel length direction of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with parts of the semiconductor layer 742, the insulating layer 726 over the semiconductor layer 742 and the electrodes 744a and 744b, and the electrode 746 over the insulating layer 726. FIGS. 21A2, 21A3, 21B1, and 21B2 are each a cross-sectional view of a top-gate transistor in the channel length direction.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 21A3). According to one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 21A2 is different from the transistor 830 in that the electrode 723 and the insulating layer 727 are included. The transistor 831 includes the electrode 723 over the insulating layer 772 and the insulating layer 727 over the electrode 723. The electrode 723 can function as a back gate electrode. Thus, the insulating layer 727 can function as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. With one embodiment of the present invention, the area occupied by a transistor can be reduced. Therefore, with one embodiment of the present invention, a highly integrated semiconductor device can be provided.

A transistor 840 illustrated in FIG. 21B1 is a type of top-gate transistor. The transistor 840 is different from the transistor 830 in that the semiconductor layer 742 is formed after the formation of the electrodes 744a and 744b. A transistor 841 illustrated in FIG. 21B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has a high on-state current for its area. That is, the area of the transistor 841 can be small for a required on-state current. With one embodiment of the present invention, the area occupied by a transistor can be reduced. Therefore, with one embodiment of the present invention, a highly integrated semiconductor device can be provided.

FIG. 22A1 illustrates a cross-sectional view in the channel width direction of the transistor 830 in FIG. 21A1. FIG. 22A2 illustrates a cross-sectional view in the channel width direction of the transistor 831 in FIG. 21A2. FIG. 22B1 illustrates a cross-sectional view in the channel width direction of the transistor 840 in FIG. 21B1. FIG. 22B2 illustrates a cross-sectional view in the channel width direction of the transistor 841 in FIG. 21B2.

Note that the transistors 831 and 841 each have the above-described S-channel structure; however, one embodiment of the present invention is not limited to this, and the transistors 831 and 841 do not necessarily have the S-channel structure.

FIGS. 23A1, 23A2, 23A3, 23B1, 23B2, 23C1, and 23C2 and FIGS. 24A1, 24A2, 24B1, 24B2, 24C1, and 24C2 show top-gate transistors different from those illustrated in FIGS. 21A1, 21A2, 21A3, 21B1, and 21B2 and FIGS. 22A1, 22A2, 22B1, and 22B2.

FIG. 23A1 is a cross-sectional view in the channel length direction of a transistor 842. FIG. 23A2 is a cross-sectional view in the channel length direction of a transistor 843. FIG. 23B1 is a cross-sectional view in the channel length direction of a transistor 844. FIG. 23B2 is a cross-sectional view in the channel length direction of a transistor 845. FIG. 23C1 is a cross-sectional view in the channel length direction of a transistor 846. FIG. 23C2 is a cross-sectional view in the channel length direction of a transistor 847.

FIG. 23A3 is a cross-sectional view in the channel length direction, which illustrates a step of manufacturing the transistor 842.

The transistor 842 illustrated in FIG. 23A1 is different from the transistor 830 or 840 in that the electrodes 744a and 744b are formed after the formation of the insulating layer 729. The electrodes 744a and 744b are electrically connected to the semiconductor layer 742 in openings formed in the insulating layers 728 and 729.

Part of the insulating layer 726 that does not overlap with the electrode 746 is removed, and the impurity 755 is introduced into the semiconductor layer 742 using the electrode 746 and the remaining insulating layer 726 as a mask, so that an impurity region can be formed in the semiconductor layer 742 in a self-aligned manner (see FIG. 23A3). The transistor 842 includes a region where the insulating layer 726 extends beyond an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region of the semiconductor layer 742 that does not overlap with the electrode 746.

The transistor 843 illustrated in FIG. 23A2 is different from the transistor 842 in that the electrode 723 is included. The transistor 843 includes the electrode 723 that is over the substrate 771 and overlaps with the semiconductor layer 742 with the insulating layer 772 therebetween. The electrode 723 can function as a back gate electrode.

As in the transistor 844 illustrated in FIG. 23B1 and the transistor 845 illustrated in FIG. 23B2, the insulating layer 726 in a region that does not overlap with the electrode 746 may be removed. Alternatively, as in the transistor 846 illustrated in FIG. 23C1 and the transistor 847 illustrated in FIG. 23C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. With one embodiment of the present invention, a transistor with favorable electrical characteristics can be provided. With one embodiment of the present invention, a highly integrated semiconductor device can be provided.

FIG. 24A1 illustrates a cross-sectional view in the channel width direction of the transistor 842 in FIG. 23A1. FIG. 24A2 illustrates a cross-sectional view in the channel width direction of the transistor 843 in FIG. 23A2. FIG. 24B1 illustrates a cross-sectional view in the channel width direction of the transistor 844 in FIG. 23B1. FIG. 24B2 illustrates a cross-sectional view in the channel width direction of the transistor 845 in FIG. 23B2. FIG. 24C1 illustrates a cross-sectional view in the channel width direction of the transistor 846 in FIG. 23C1. FIG. 24C2 illustrates a cross-sectional view in the channel width direction of the transistor 847 in FIG. 23C2.

Note that the transistors 843, 845, and 847 each have the above-described S-channel structure; however, one embodiment of the present invention is not limited to this, and the transistors 843, 845, and 847 do not necessarily have the S-channel structure.

FIGS. 25A1 and 25A2 illustrate a modification example of the transistor 845 illustrated in FIG. 23B2 and FIG. 24B2. FIG. 25A1 is a cross-sectional view in the channel length direction of a transistor 845A, and FIG. 25A2 is a cross-sectional view in the channel width direction of the transistor 845A.

The transistor 845A in FIGS. 25A1 and 25A2 is the same as the transistor 845 except the positions of the insulating layers 729 and 728.

At least part of this embodiment can be implemented in combination with any of the other embodiments and the other examples described in this specification as appropriate.

Embodiment 5

Figure 26A:
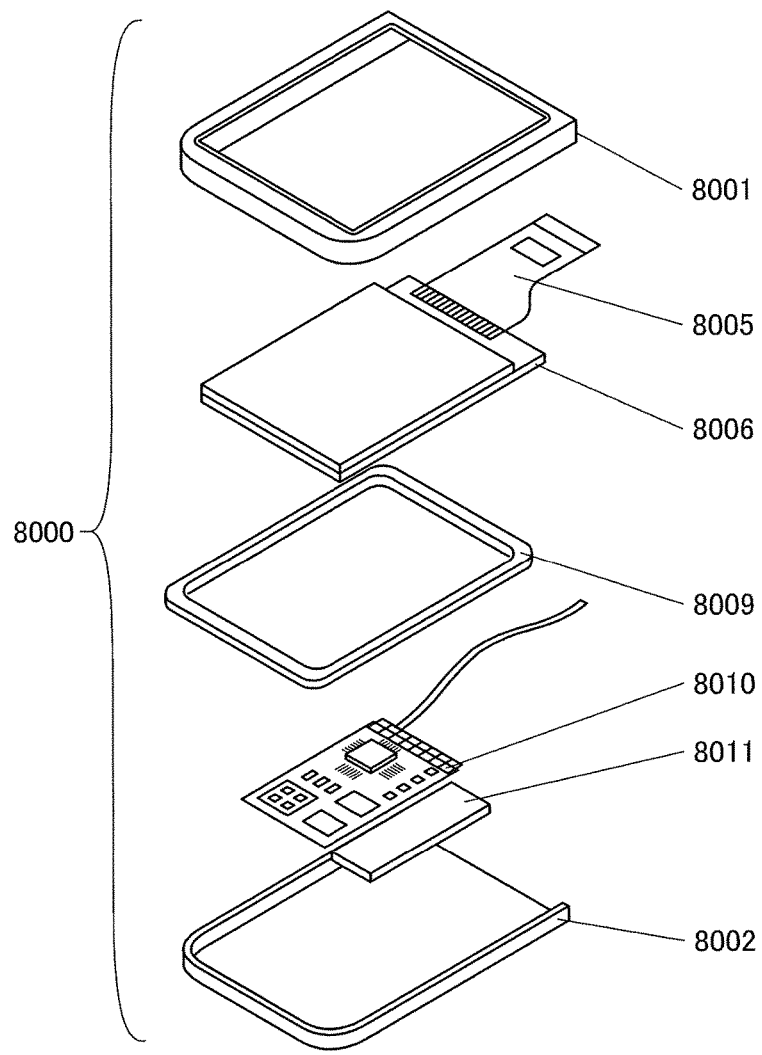
FIGS. 26A and 26B each illustrate a structure of a display module.

In this embodiment, a display module using the display device of one embodiment of the present invention will be described. In a display module 8000 in FIG. 26A, a display panel 8006 connected to an FPC 8005, a frame 8009, a printed circuit board 8010, and a battery 8011 are between an upper cover 8001 and a lower cover 8002.

The display device of one embodiment of the present invention can be used for the display panel 8006, for example. In that case, a display module that offers high visibility and low power consumption can be obtained. The shapes and sizes of the upper cover 8001 and the lower cover 8002 can be changed as appropriate in accordance with the size of the display panel 8006.

In addition, the display panel 8006 includes the touch sensor of one embodiment of the present invention.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

Figure 26B:
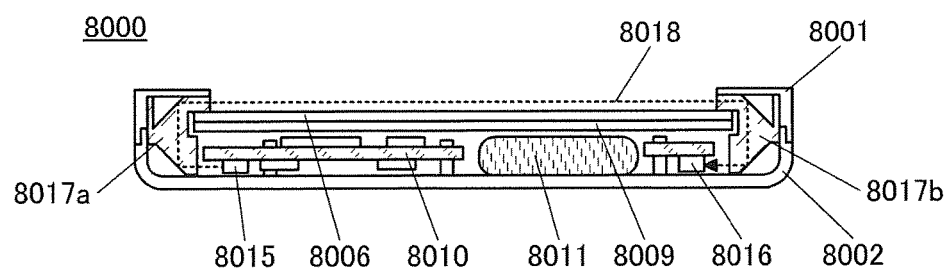

FIG. 26B is a cross-sectional schematic view of the display module 8000 with an optical touch sensor.

The display module 8000 includes a light-emitting portion 8015 and a light-receiving portion 8016 that are provided on the printed circuit board 8010. A pair of light guide portions (a light guide portion 8017a and a light guide portion 8017b) is provided in a region surrounded by the upper cover 8001 and the lower cover 8002.

The display panel 8006 overlaps with the printed circuit board 8010 and the battery 8011 with the frame 8009 located therebetween. The display panel 8006 and the frame 8009 are fixed to the light guide portion 8017a and the light guide portion 8017b.

Light 8018 emitted from the light-emitting portion 8015 travels over the display panel 8006 through the light guide portion 8017a and reaches the light-receiving portion 8016 through the light guide portion 8017b. For example, blocking of the light 8018 by a sensing target such as a finger or a stylus can be detected as touch operation.

A plurality of light-emitting portions 8015 are provided along two adjacent sides of the display panel 8006, for example. A plurality of light-receiving portions 8016 are provided so as to face the light-emitting portions 8015 with the display panel 8006 located therebetween. Accordingly, information about the position of touch operation can be obtained.

As the light-emitting portion 8015, a light source such as an LED element can be used. It is particularly preferable to use a light source that emits infrared light, which is not visually recognized by users and is harmless to users, as the light-emitting portion 8015.

As the light-receiving portion 8016, a photoelectric element that receives light emitted by the light-emitting portion 8015 and converts it into an electrical signal can be used. A photodiode that can receive infrared light can be favorably used.

For the light guide portions 8017a and 8017b, members that transmit at least the light 8018 can be used. With the use of the light guide portions 8017a and 8017b, the light-emitting portion 8015 and the light-receiving portion 8016 can be placed under the display panel 8006, and a malfunction of the touch sensor due to external light reaching the light-receiving portion 8016 can be suppressed. It is particularly preferable to use a resin that absorbs visible light and transmits infrared light. This is more effective in suppressing the malfunction of the touch sensor.

At least part of this embodiment can be implemented in combination with any of the other embodiments and the other examples described in this specification as appropriate.

Embodiment 6

Examples of an electronic device that can use the display device of one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 27A to 27F illustrate specific examples of these electronic devices.

Figure 27A:
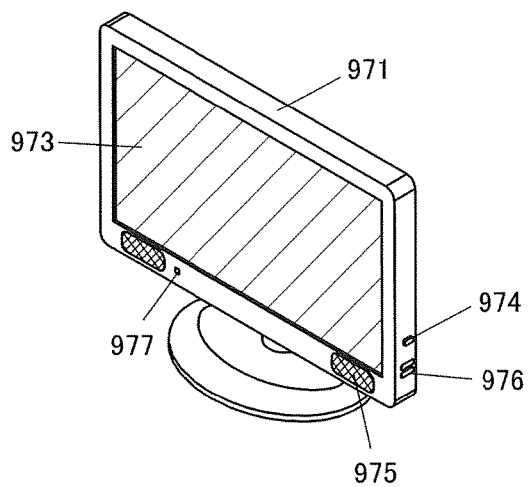
FIGS. 27A to 27F each illustrate an electronic device.

FIG. 27A is a television that includes a housing 971, a display portion 973, an operation key 974, speakers 975, communication connection terminal 976, an optical sensor 977, and the like. The display portion 973 is provided with a touch sensor, with which an input operation can be performed. The display portion 973 including the display device of one embodiment of the present invention can have reduced power consumption.

Figure 27B:
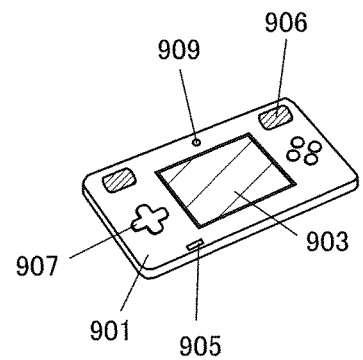

FIG. 27B illustrates a portable game machine that includes a housing 901, a display portion 903, a microphone 905, speakers 906, operation keys 907, a camera 909, and the like. The display portion 903 including the display device of one embodiment of the present invention can have reduced power consumption.

Figure 27C:
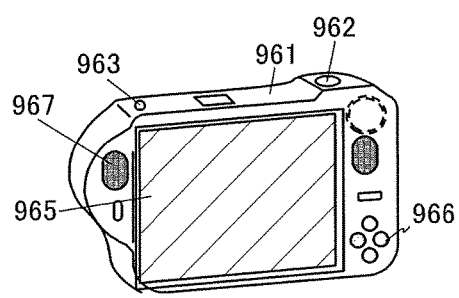

FIG. 27C illustrates a digital camera that includes a housing 961, a shutter button 962, a microphone 963, a speaker 967, a display portion 965, operation keys 966, and the like. The display portion 965 including the display device of one embodiment of the present invention can have reduced power consumption.

Figure 27D:
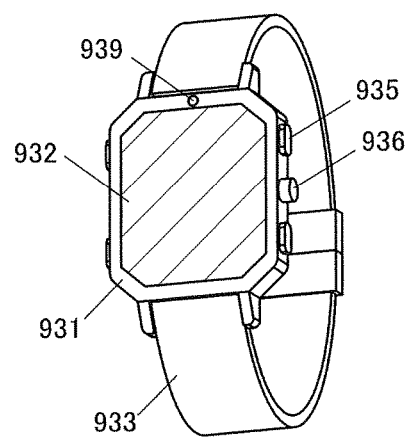

FIG. 27D illustrates a wristwatch information terminal that includes a housing 931, a display portion 932, a wristband 933, operation buttons 935, a winder 936, a camera 939, and the like. The display portion 932 may be a touch panel. The display portion 932 including the display device of one embodiment of the present invention can have reduced power consumption.

Figure 27E:
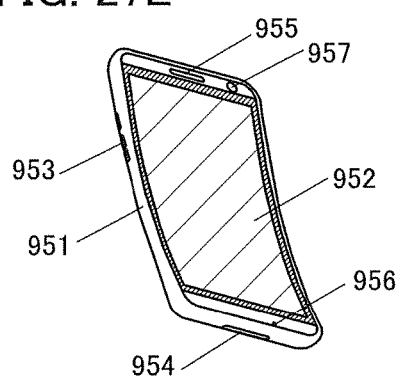

FIG. 27E is an example of a mobile phone that includes a housing 951, a display portion 952, an operation button 953, an external connection port 954, a speaker 955, a microphone 956, a camera 957, and the like. The mobile phone includes a touch sensor in the display portion 952. Operations such as making a call and inputting a character can be performed by touch on the display portion 952 with a finger, a stylus, or the like. The display portion 952 including the display device of one embodiment of the present invention can have reduced power consumption.

Figure 27F:
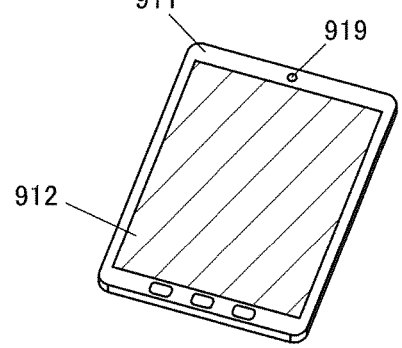

FIG. 27F illustrates a portable data terminal that includes a housing 911, a display portion 912, a camera 919, and the like. The touch panel function of the display portion 912 enables input and output of information. The display portion 912 including the display device of one embodiment of the present invention can have reduced power consumption.

Figure 28A:
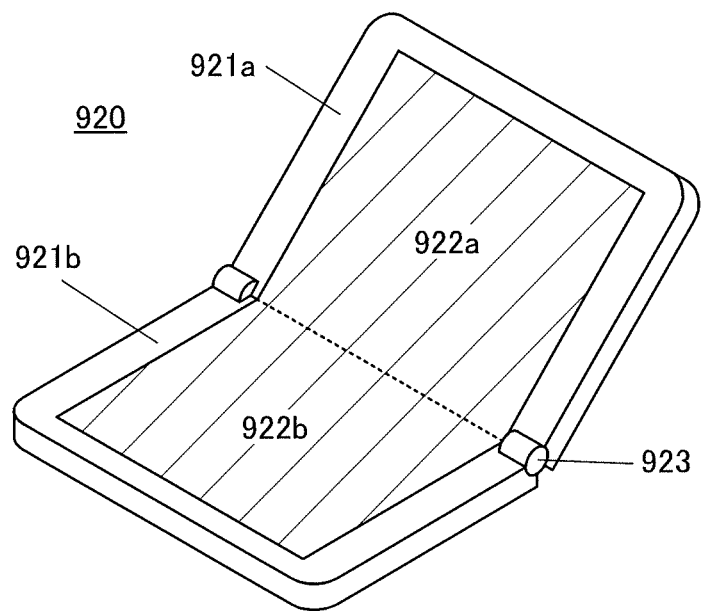
FIGS. 28A and 28B each illustrate an electronic device.
Figure 28B:
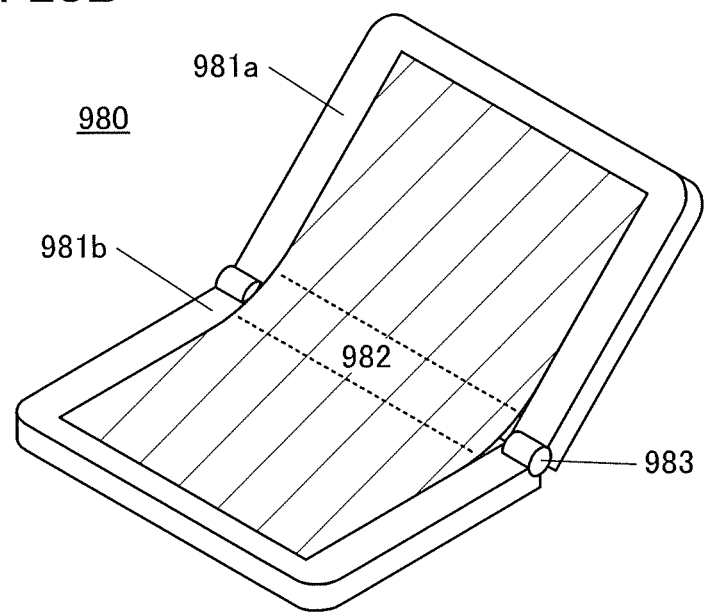

FIGS. 28A and 28B illustrate foldable electronic devices.

An electronic device 920 shown in FIG. 28A includes a housing 921a, a housing 921b, a hinge 923, a display portion 922a, a display portion 922b, and the like. The display portion 922a and the display portion 922b are incorporated in the housing 921a and the housing 921b, respectively.

The housing 921a and the housing 921b are rotatably joined to each other by the hinge 923. The electronic device 920 can be changed in shape between a state where the housing 921a and the housing 921b are closed and a state where the housing 921a and the housing 921b are opened as illustrated in FIG. 28A. Thus, the electronic device 920 has high portability when carried and excellent visibility when used because of its large display region.

The hinge 923 preferably includes a locking mechanism so that an angle formed between the housing 921a and the housing 921b does not become larger than a predetermined angle when the housing 921a and the housing 921b are opened. For example, an angle at which they become locked (they are not opened any further) is preferably greater than or equal to 90° and less than 180° and can be typically 90°, 120°, 135°, 150°, or the like. In that case, the convenience, the safety, and the reliability can be improved.

At least one of the display portion 922a and the display portion 922b can function as a touch panel and be controlled with a finger, a stylus, or the like.

One of the housing 921a and the housing 921b is provided with a wireless communication module, and data can be transmitted and received through a computer network such as the Internet, a local area network (LAN), or Wi-Fi (registered trademark).

One flexible display may be incorporated in the display portion 922a and the display portion 922b. In that case, an image can be displayed continuously across the display portion 922a and the display portion 922b.

In an electronic device 980 illustrated in FIG. 28B, a flexible display portion 982 is across a housing 981a and a housing 981b which are joined to each other by a hinge 983.

At least part of the display portion 982 can be bent. The display portion 982 can display an image while being bent since pixels are continuously arranged from the housing 981a to the housing 981b.

The hinge 983 includes the above-described locking mechanism, and thus excessive force is not applied to the display portion 982; therefore, breakage of the display portion 982 can be prevented. Consequently, a highly reliable electronic device can be obtained.

At least part of this embodiment can be implemented in combination with any of the other embodiments and the other examples described in this specification as appropriate.

This application is based on Japanese Patent Application Serial No. 2016-182655 filed with Japan Patent Office on Sep. 20, 2016, the entire contents of which are hereby incorporated by reference.

What is claimed is:

1. A display device comprising:
    a first substrate;
    a second substrate provided over the first substrate;
    a first element layer including a first display element, the first element layer provided over the first substrate and below the second substrate;
    a second element layer including a first transistor and a second transistor, the second element layer provided over the first substrate and below the first element layer;
    a third element layer including a second display element, the third element layer provided over the first substrate and below the second element layer;
    an input device provided over the first element layer and below the second substrate; and
    a driver circuit provided over the first substrate,
    wherein the first substrate and the second substrate overlap with each other,
    wherein the first display element, the second display element, the first transistor, and the second transistor are between a first surface of the first substrate and a first surface of the second substrate,
    wherein the first display element is a reflective liquid crystal element electrically connected to the first transistor,
    wherein the second display element is a light-emitting element electrically connected to the second transistor,
    wherein a second surface of the second substrate opposite to the first surface of the second substrate is provided with a first anti-reflection layer,
    wherein the first surface of the first substrate is provided with the driver circuit, and
    wherein the input device and the driver circuit are electrically connected to each other through an FPC.

2. The display device according to claim 1,
    wherein the first display element, the second display element, the first transistor, and the second transistor are in the same pixel unit.

3. The display device according to claim 1,
    wherein the driver circuit is configured to drive the first display element, the second display element, and the input device.

4. The display device according to claim 1, further comprising a second anti-reflection layer provided on the first surface of the second substrate.

5. The display device according to claim 1,
    wherein the first anti-reflection layer is a dielectric layer.

6. The display device according to claim 1,
    wherein the first anti-reflection layer has an anti-glare pattern.

7. The display device according to claim 1,
    wherein the input device includes a wiring including a first layer provided on the first surface of the second substrate and a second layer in contact with the first layer, and
    wherein the first layer has a lower reflectance than the second layer.

8. The display device according to claim 1, further comprising a light diffusion plate and a polarizing plate under the input device and over the first element layer.

9. The display device according to claim 1,
    wherein each of the first transistor and the second transistor has a channel formation region comprising a metal oxide.

10. An electronic device comprising:
    the display device according to claim 1;
    a first housing;
    a second housing; and
    a hinge,
    wherein the display device is across the first housing and the second housing that are joined to each other by the hinge, and
    wherein part of the display device is capable of being bent.

11. A display device comprising:
    a first substrate;
    a first element layer including a first display element, the first element layer provided over the first substrate;
    a second element layer including a first transistor and a second transistor, the second element layer provided over the first substrate and below the first element layer;
    a third element layer including a second display element, the third element layer provided over the first substrate and below the second element layer;
    a driver circuit over the first substrate;
    an input device over the first element layer;
    a second substrate over the input device; and
    a first anti-reflection layer over the second substrate,
    wherein the first display element is a reflective liquid crystal element electrically connected to the first transistor,
    wherein the second display element is a light-emitting element electrically connected to the second transistor, and
    wherein the input device and the driver circuit are electrically connected to each other through an FPC.

12. The display device according to claim 11,
    wherein the first display element, the second display element, the first transistor, and the second transistor are in the same pixel unit.

13. The display device according to claim 11,
    wherein the driver circuit is configured to drive the first display element, the second display element, and the input device.

14. The display device according to claim 11, further comprising a second anti-reflection layer between the second substrate and the input device.

15. The display device according to claim 11,
    wherein the first anti-reflection layer is a dielectric layer.

16. The display device according to claim 11,
    wherein the first anti-reflection layer has an anti-glare pattern.

17. The display device according to claim 11,
wherein the input device includes a wiring including a first layer adjacent to the second substrate and a second layer in contact with the first layer, and
wherein the first layer has a lower reflectance than the second layer.

18. The display device according to claim 11, further comprising a light diffusion plate and a polarizing plate between the input device and the first element layer.

19. The display device according to claim 11,
wherein each of the first transistor and the second transistor has a channel formation region comprising a metal oxide.

20. An electronic device comprising:
the display device according to claim 11;
a first housing;
a second housing; and
a hinge,
wherein the display device is across the first housing and the second housing that are joined to each other by the hinge, and
wherein part of the display device is capable of being bent.

21. The display device according to claim 1, further comprising a third substrate between the first element layer and the input device.

22. The display device according to claim 1, wherein the light-emitting element is overlapped with an opening of a reflective electrode of the reflective liquid crystal element.

23. The display device according to claim 11, further comprising a third substrate between the first element layer and the input device.

24. The display device according to claim 11, wherein the light-emitting element is overlapped with an opening of a reflective electrode of the reflective liquid crystal element.

* * * * *